(12) United States Patent
Kim et al.

(10) Patent No.: US 12,382,589 B2
(45) Date of Patent: Aug. 5, 2025

(54) PRINTED CIRCUIT BOARD AND ELECTRONIC DEVICE COMPRISING COUPLER

(71) Applicant: SAMSUNG ELECTRONICS CO., LTD., Suwon-si (KR)

(72) Inventors: Youngjoon Kim, Suwon-si (KR); Jonghyun Park, Suwon-si (KR); Dongil Yang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 413 days.

(21) Appl. No.: 18/093,947

(22) Filed: Jan. 6, 2023

(65) Prior Publication Data

US 2023/0146499 A1    May 11, 2023

Related U.S. Application Data

(63) Continuation of application No. PCT/KR2021/008505, filed on Jul. 5, 2021.

(30) Foreign Application Priority Data

Jul. 7, 2020    (KR) .................. 10-2020-0083761

(51) Int. Cl.
H05K 5/00 (2025.01)
H05K 1/16 (2006.01)
H05K 3/30 (2006.01)

(52) U.S. Cl.
CPC .......... *H05K 5/0026* (2013.01); *H05K 1/162* (2013.01); *H05K 3/306* (2013.01); *H05K 2201/10098* (2013.01); *H05K 2201/10265* (2013.01)

(58) Field of Classification Search
CPC ..................................................... H05L 5/0026
(Continued)

(56) References Cited

U.S. PATENT DOCUMENTS 9,444,127 B2   9/2016   Katabuchi et al.
9,531,053 B2   12/2016   Fujiwara et al.
(Continued)

FOREIGN PATENT DOCUMENTS

JP   2002-280812 A   9/2002
JP   2002280812   *   9/2022
(Continued)

OTHER PUBLICATIONS

Communication issued Oct. 27, 2023 by the European Patent Office in European Patent Application No. 21837920.4.
(Continued)

*Primary Examiner* — Stanley Tso
(74) *Attorney, Agent, or Firm* — Sughrue Mion, PLLC

(57) ABSTRACT

A coupler includes: a first layer including a first conductive flat plate; a second layer including a signal transmission line electrically connected to the first conductive flat plate, the second layer including a first line port configured to input a signal output from a wireless communication circuit, and a second line port electrically connected to an antenna; a third layer electrically connected to the first conductive flat plate and including a first conductive pattern electrically connected to the signal transmission line; and a capacitor electrically connected to the first conductive flat plate.

17 Claims, 21 Drawing Sheets

(58) Field of Classification Search
USPC .......................................................... 361/748
See application file for complete search history.

(56) References Cited

U.S. PATENT DOCUMENTS

| | | |
|---|---|---|
| 9,905,901 B1 | 2/2018 | Lyu et al. |
| 10,059,273 B1 | 8/2018 | Mercurio |
| 10,396,421 B2 | 8/2019 | Zhang et al. |
| 10,464,495 B2 | 11/2019 | Mercurio |
| 10,637,123 B2 | 4/2020 | Yasuda |
| 10,700,404 B2 | 6/2020 | Han |
| 10,735,045 B2 | 8/2020 | Khlat et al. |
| 10,826,152 B2 | 11/2020 | Messina |
| 10,892,538 B2 | 1/2021 | Hanaoka |
| 10,910,690 B2 | 2/2021 | Tamaru |
| 11,374,300 B2 | 6/2022 | Park et al. |
| 2005/0062557 A1 | 3/2005 | Kang et al. |
| 2016/0028144 A1 | 1/2016 | Katabuchi et al. |
| 2016/0248141 A1 | 8/2016 | Fujiwara et al. |
| 2018/0062235 A1 | 3/2018 | Lyu et al. |
| 2018/0233796 A1 | 8/2018 | Zhang et al. |
| 2019/0006729 A1* | 1/2019 | Tamaru .................. H03H 1/00 |
| 2019/0009729 A1 | 1/2019 | Mercurio |
| 2019/0067784 A1 | 2/2019 | Yasuda |
| 2019/0067785 A1 | 2/2019 | Messina |
| 2019/0165444 A1 | 5/2019 | Han |
| 2019/0237843 A1 | 8/2019 | Hanaoka |
| 2019/0326944 A1 | 10/2019 | Khlat et al. |
| 2020/0328492 A1 | 10/2020 | Park et al. |

FOREIGN PATENT DOCUMENTS

| | | |
|---|---|---|
| KR | 10-2003-0050467 A | 6/2003 |
| KR | 10-2005-0029928 A | 3/2005 |
| KR | 10-1633054 B1 | 6/2016 |
| KR | 10-2019-0063090 A | 6/2019 |
| KR | 10-2020-0121201 A | 10/2020 |

OTHER PUBLICATIONS

Office Action issued Oct. 2, 2024 by the Korean Intellectual Property Office in Korean Patent Application No. 10-2020-0083761.

Zaidel, et al., "5G Coupler Design for Intelligent Transportation System (ITS) Application", 2017, International Journal of Electrical and Computer Engineering (IJECE), vol. 7, No. 2, 6 pages total, DOI: 10.11591/ijece.v7i2.pp899-904.

Written Opinion (PCT/ISA/237) issued Oct. 20, 2021 by the International Searching Authority for International Application No. PCT/KR2021/008505.

International Search Report (PCT/ISA/220, PCT/ISA/210) issued Oct. 20, 2021 by the International Searching Authority for International Application No. PCT/KR2021/008505.

* cited by examiner

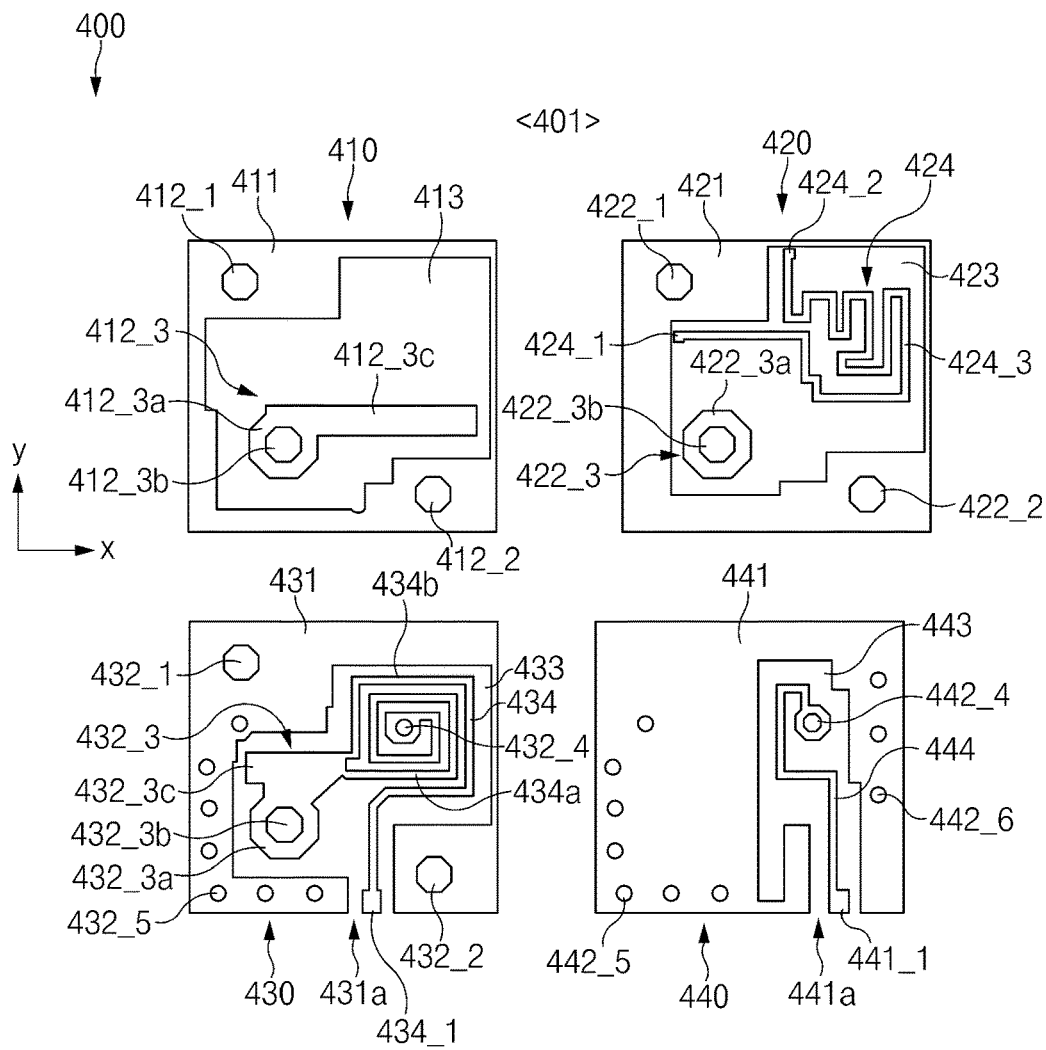
FIG.4A
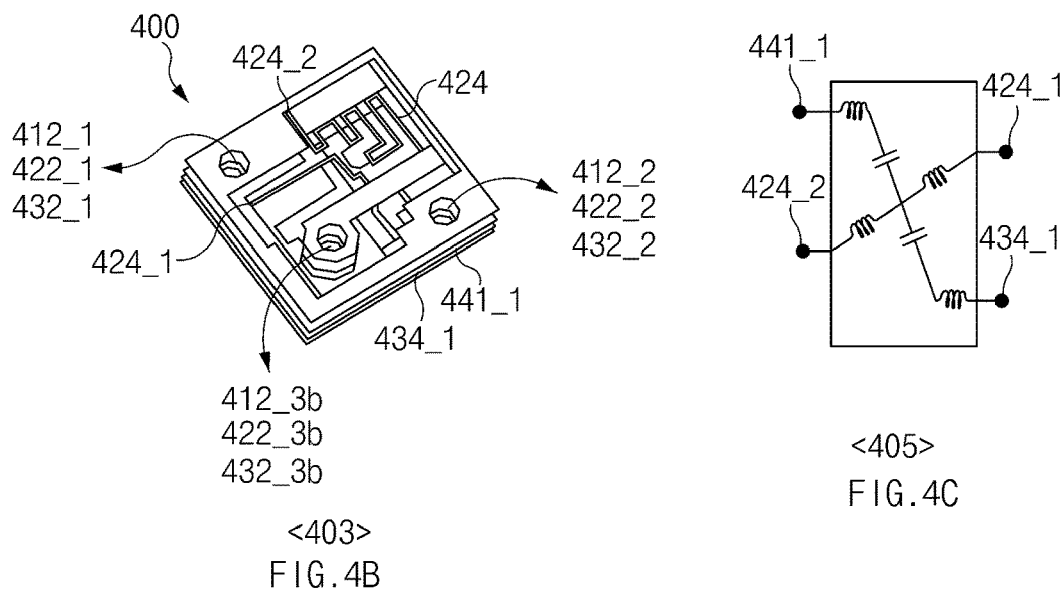
FIG.4B
FIG.4C

<503>

<505>

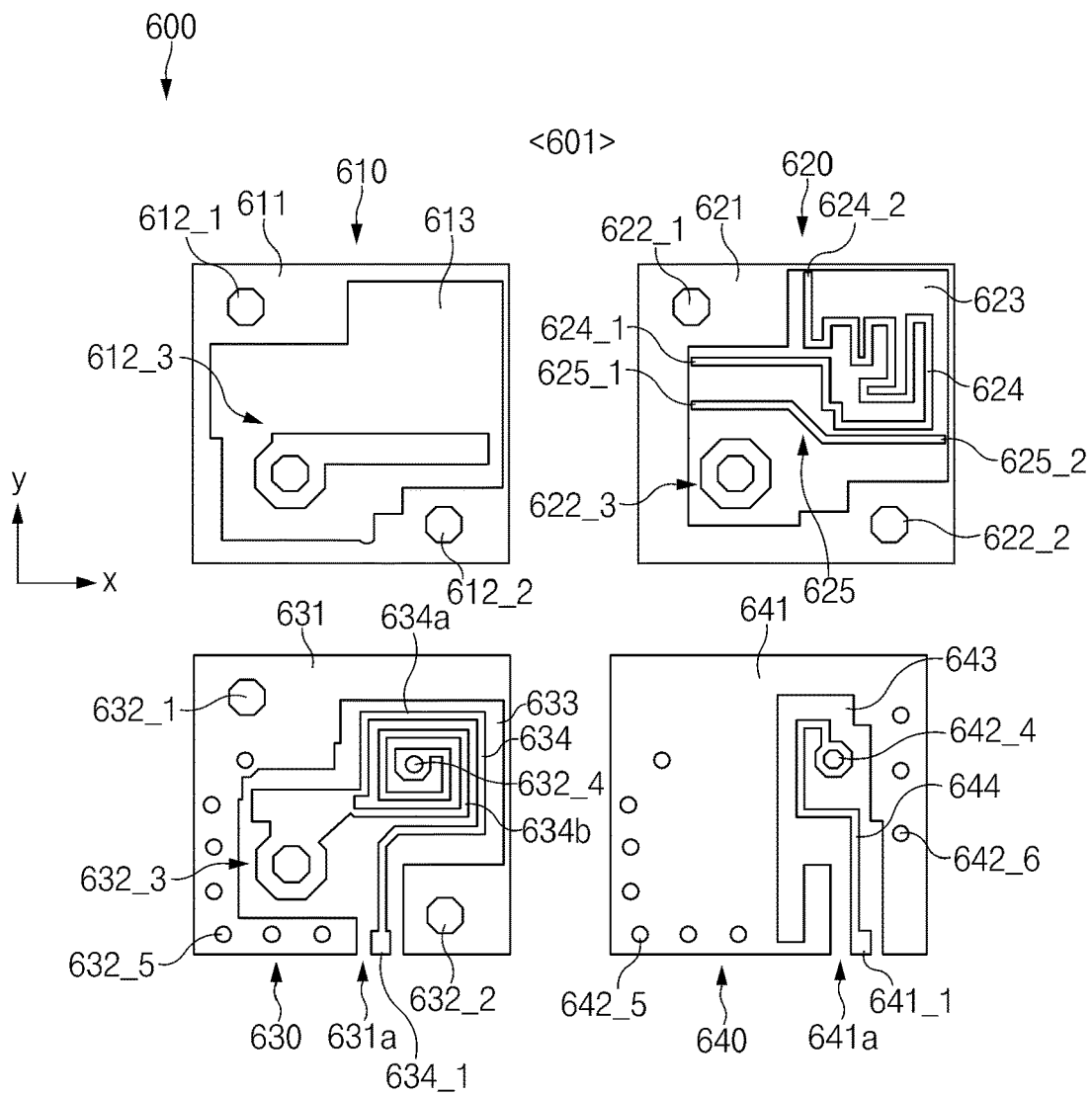
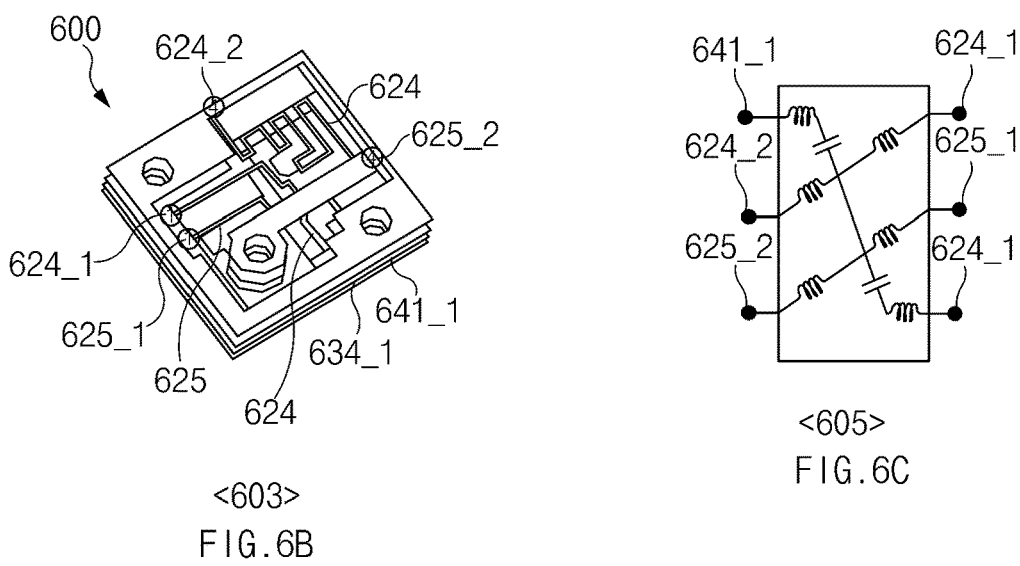
FIG.6A
FIG.6B
FIG.6C

<703>

<705>

<901>

<903>

| CAPACITANCE OF TUNABLE CAPACITOR | | CHARACTERISTIC INDEX | LOW(0.76) | | MID(2GHz) | | HIGH(2.7GHz) | | SUB6(3.5GHz) | | 0.7G~2.7G Max difference | |
|---|---|---|---|---|---|---|---|---|---|---|---|---|
| | | | SIMULATION | MEASUREMENT | SIMULATION | MEASUREMENT | SIMULATION | MEASUREMENT | SIMULATION | MEASUREMENT | SIMULATION | MEASUREMENT |
| REFERENCE | no Cap. | Coupling (521) | -28.4 | -28.3(Δ0.1) | -20.2 | -19.7(Δ0.5) | -18.5 | -17.2(Δ1.3) | -17.4 | -16.9 | 11 (spec.fail) | 11.4 (spec.fail) |
| NEW TUNABLE | 0.5pF | | -27.4 | -25.1(Δ2.3) | -20.8 | -21.0(Δ2.2) | -19.8 | -19.8(Δ0.0) | -19.5 | -22.5 | 7.9 | 5.3 |
| | 1.5pF | | -28.6 | -25.9(Δ2.7) | -22.7 | -23.6(Δ0.9) | -23.2 | -23.3(Δ0.1) | -23.9 | -25.5 | 5.9 | 2.6 |
| | 3pF | | -29.1 | -27.7(Δ1.4) | -26.0 | -26.8(Δ0.8) | -27.3 | -26.1(Δ1.2) | -25.1 | -25.1 | 4.0 | 2.6 |

FIG. 10A

PRINTED CIRCUIT BOARD AND ELECTRONIC DEVICE COMPRISING COUPLER

CROSS-REFERENCE TO RELATED APPLICATIONS

This application is a by-pass continuation application of International Application No. PCT/KR2021/008505, filed on Jul. 5, 2021, which is based on and claims priority to Korean Patent Application No. 10-2020-0083761, filed on Jul. 7, 2020, in the Korean Intellectual Property Office, the disclosures of which are incorporated by reference herein in their entireties.

BACKGROUND

1. Field

Various embodiments of the disclosure relate to a printed circuit board and an electronic device including a coupler.

2. Description of Related Art

Electronic devices, such as mobile devices, may perform communication with base stations that provide wireless communication networks through communication components. Over time, such electronic devices have been miniaturized, slimmed, and/or integrated with other electronic devices. Frequencies used by the communication components included within the electronic devices have, with time, become higher and their bands have become narrower.

Among the communication components included in the electronic devices, a coupler may be adapted to induce some of the transmitted signals, and for example, may be used to transmit an output of a specific magnitude through an antenna by sampling some of the outputs output from an amplifier of a transmission terminal of a wireless communication circuit and delivering the sampled outputs to an automatic output adjuster.

The coupler may be disposed on a printed circuit board after being formed as a separate part. When the coupler is surface-mounted on the printed circuit board, the printed circuit board may occupy an excessive interior space of the electronic device due to the volume of the surface-mounted coupler. Additionally, the electronic device may further include a shield can to protect the coupler from electromagnetic influences of other electronic components mounted on the substrate or other electronic components of the electronic device, on which the substrate is mounted. Space occupied by the surface-mounted coupler and the shield can in the electronic device may make miniaturizing, slimming, and/or integrating the electronic device difficult to achieve.

SUMMARY

Provided are a coupler formed in a printed circuit board, and an electronic device including the same.

According to an aspect of the disclosure, a coupler includes: a first layer including a first conductive flat plate; a second layer including a signal transmission line electrically connected to the first conductive flat plate, the second layer including a first line port configured to input a signal output from a wireless communication circuit, and a second line port electrically connected to an antenna; a third layer electrically connected to the first conductive flat plate and including a first conductive pattern electrically connected to the signal transmission line; and a capacitor electrically connected to the first conductive flat plate.

The first layer may further include: a first conductive part that is electrically conductive; and a first opening formed at at least a portion of an inside of the first conductive part, and the first conductive flat plate may be electrically isolated from the first conductive part by the first opening.

The first conductive flat plate may include: a first hole periphery part defining a first via hole configured to allow electrical connection; and an extension part extending from the first hole periphery part and overlapping at least a portion of the signal transmission line, the extension part being spaced apart from the signal transmission line at a specific interval, and the capacitor may be electrically connected to the extension part.

The second layer may further include: a second conductive part that is electrically conductive and electrically connected to the first conductive part; a second opening formed at at least a portion of an inside of the second conductive part; and a second conductive flat plate disposed in the second opening, the second conductive flat plate defining a second via hole that is electrically connected to a first via hole.

The third layer may further include: a third conductive part that is electrically conductive and electrically connected to the second conductive part; a third opening formed at at least a portion of an inside of the third conductive part; and a third conductive flat plate disposed in the third opening and is electrically connected to the first conductive pattern, the third conductive flat plate defining a third via hole electrically connected to the second via hole.

An area of the first conductive flat plate may be larger than an area of the third conductive flat plate.

The coupler may further include a fourth layer adjacent to the third layer, wherein the fourth layer may include: a fourth conductive part that is electrically connected to the third conductive part and is electrically conductive; a fourth opening formed at at least a portion of an inside of the fourth conductive part; and a second conductive pattern disposed in the fourth opening and electrically connected to the first conductive flat plate.

The first conductive pattern may include a first pattern via hole formed on one side thereof, and the second conductive pattern may include: a second pattern via hole electrically connected to the first pattern via hole; and a terminal port electrically connected to a terminal resistor.

The first conductive pattern may have at least one turn.

The first conductive pattern may further include: a first coiling portion coiled in a first direction; and a second coiling portion coiled in a second direction.

One end of the first coiling portion may include a coupling port configured to transmit a coupling signal to the wireless communication circuit.

The first layer may further include a fourth conductive flat plate electrically connected to the first conductive flat plate, the fourth conductive flat plate defining a fourth via hole.

The coupler may further include a fifth layer adjacent to the first layer, wherein the fifth layer may include: a fifth hole periphery part defining a fifth via hole electrically connected to the fourth via hole; and a first capacitor via hole electrically connected to the fifth hole periphery part.

The coupler may further include: a sixth layer adjacent to the fifth layer, the sixth layer may include a capacitor connecting pad defining a second capacitor via hole, the second capacitor via hole being electrically connected to the first capacitor via hole, and the capacitor may be electrically connected to the first conductive flat plate by the second capacitor via hole.

The capacitor may include at least one of a tunable capacitor and a shunt capacitor, the signal transmission line may include at least one of: a first signal transmission line configured to transmit a signal of a first frequency band; and a second signal transmission line configured to transmit a signal of a second frequency band that is different from the first frequency band.

According to various embodiments of the disclosure, a spatial loss for disposing a coupler formed as a separate part in a printed circuit board may be reduced by forming at least a portion of the coupler in the printed circuit board.

Furthermore, according to various embodiments of the disclosure, a coupler that may perform coupling for signals of various frequency bands or provide a tuning function for a frequency band that is to be covered may be formed.

In addition, according to various embodiments of the disclosure, a size of a coupler may be reduced by forming characteristics of the coupler in a single direction, and thus the number of passive elements (e.g., resistors) added for stability of the coupler may be reduced.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 4A, 4B, and 4C are views illustrating structures of layers of a coupler 400 embedded in a printed circuit board according to an embodiment of the disclosure;

FIGS. 6A, 6B, and 6C are views illustrating structures of layers of a coupler 600 embedded in a printed circuit board according to an embodiment of the disclosure;

FIG. 10A is a view illustrating change values of capacitances of an adjusting capacitor of a coupler including the adjusting capacitor according to various embodiments;

DETAILED DESCRIPTION

Hereinafter, various embodiments of the disclosure will be described with reference to the accompanying drawings.

Figure 1A:
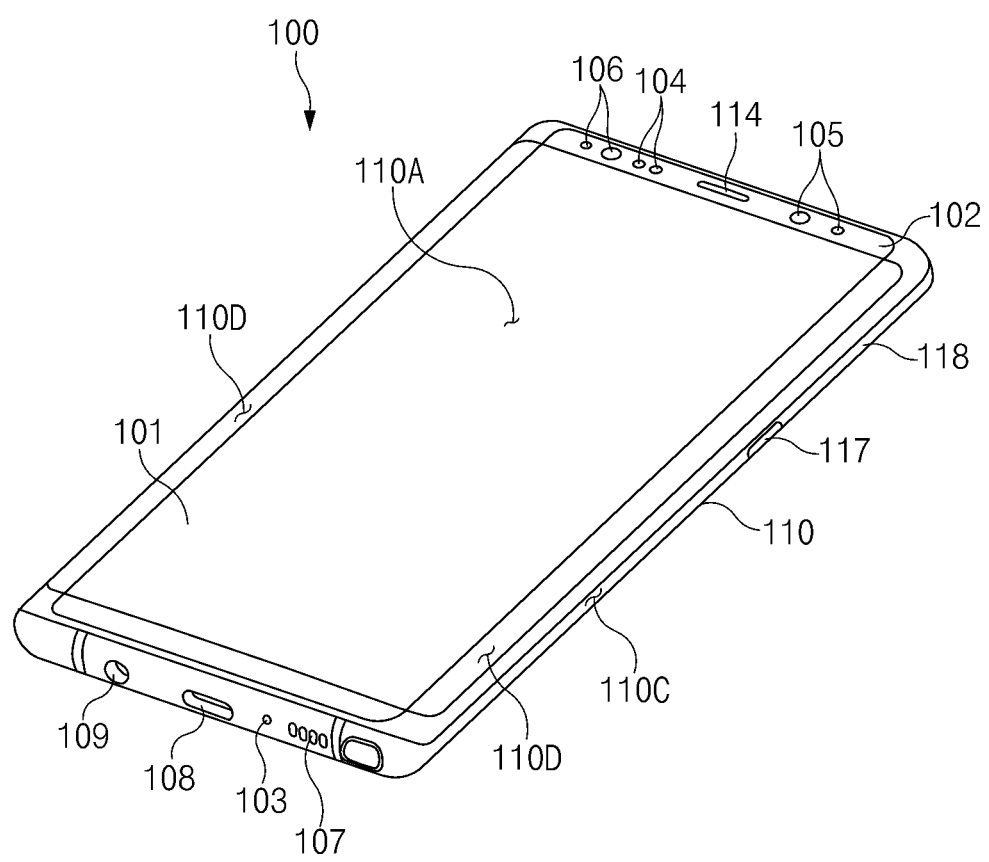
FIG. 1A illustrates a perspective view of an electronic device in a first direction according to an embodiment.
Figure 1B:
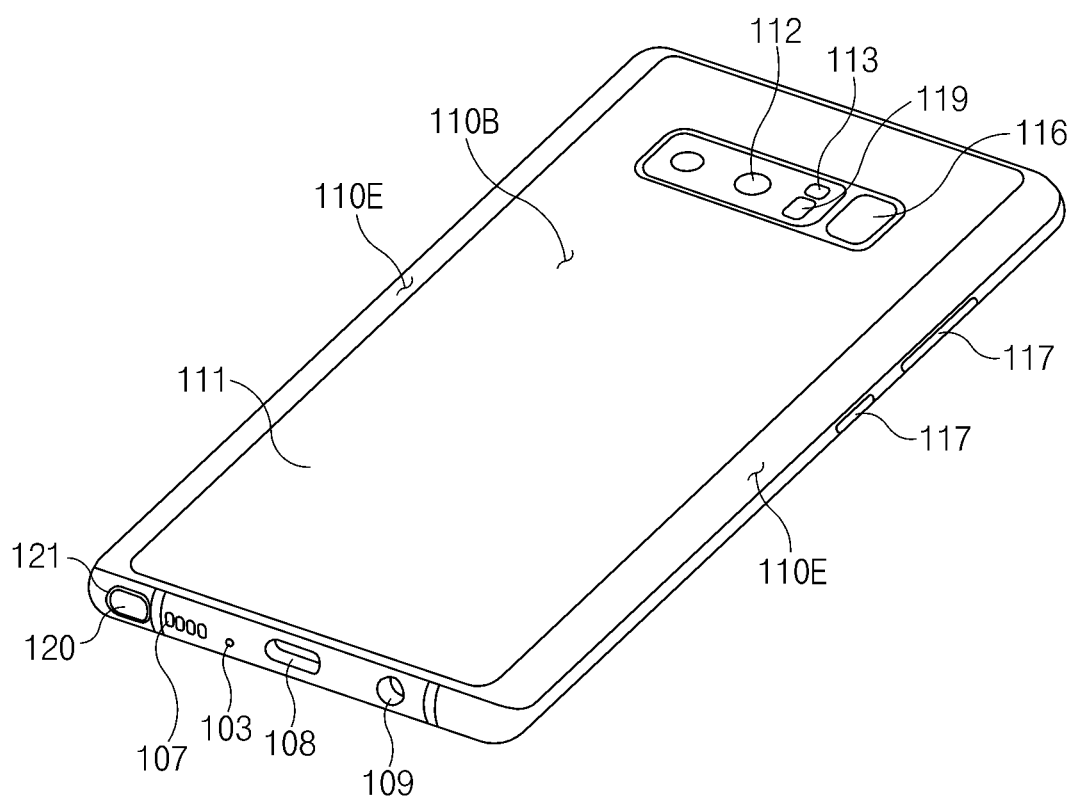
FIG. 1B illustrates a perspective view of an electronic device in a second direction according to an embodiment.

FIG. 1A illustrates a perspective view of an electronic device in a first direction according to an embodiment. FIG. 1B illustrates a perspective view of the electronic device in a second direction according to an embodiment.

Referring to FIGS. 1A and 1B, an electronic device 100 may include a housing 110 including a first surface (e.g., a front surface) 110A, a second surface (e.g., a rear surface) 110B, and a side surface 110C surrounding a space between the first surface 110A and the second surface 110B. In some embodiments, the housing may refer to a structure that defines some of the first surface 110A, the second surface 110B, and the side surface 110C of FIG. 1A. The first surface 110A may be defined by a front plate 102 (e.g., a glass plate or a polymer plate including various coating layers), at least a portion of which is substantially transparent. The second surface 110B may be defined by a substantially opaque rear plate 111. The rear plate 111, for example, may be formed of coated or colored glass, ceramics, a polymer, a metal (e.g., aluminum, stainless steel (STS), or magnesium), or a combination of at least two thereof. The side surface 110C may be coupled to the front plate 102 and the rear plate 111, and may be defined by a side bezel structure (e.g., 'a side member') 118 including a metal and/or a polymer. In some embodiments, the rear plate 111 and the side bezel structure 118 may be integrally formed and may include the same material (e.g., a metallic material such as aluminum).

The front plate 102 may include two first areas 110D that are deflected from the first surface 110A toward the rear plate 111 and extend seamlessly, at opposite ends of a long edge of the front plate 102. As seen in FIG. 1B, the rear plate 111 may include two second areas 110E that are deflected from the second surface 110B toward the front plate 102 and extend seamlessly, at opposite ends of a long edge of the rear plate 111. In some embodiments, the front plate 102 (or the rear plate 111) may include only one of the first areas 110D (or the second areas 110E). In other embodiments, some of the first areas 110D or the second areas 110E may not be included. In the embodiments, when viewed from a side of the electronic device 100, the side bezel structure 118 may have a first thickness (width) on a side surface, on which neither the first areas 110D nor the second areas 110E are included, and may have a second thickness that is smaller than the first thickness on a side surface, on which the first areas 110D or the second areas 110E are included.

The electronic device 100 may include at least one of a display 101, audio modules 103, 107, and 114, sensor modules 104, 116, and 119, camera modules 105, 112, and 113, a key input device 117, a light emitting element 106, a pen input device 120, and connector holes 108 and 109. In some embodiments, at least one (e.g., the key input device 117 or the light emitting element 106) of the components may be omitted from the electronic device 100 or another component may be additionally included in the electronic device 100.

The display 101, for example, may be exposed through considerable portions of the front plate 102. In some embodiments, at least a portion of the display 101 may be exposed through the front plate 102 that defines the first surface 110A, and the first areas 110D of the side surface 110C. In some embodiments, corners of the display 101 may have a shape that is substantially the same as the adjacent outer shape of the front plate 102. In some embodiments, in order to expand the area, by which the display 101 is exposed, the distances between the outskirts of the display 101 and the outskirts of the front plate 102 may be substantially the same.

In some embodiments, a portion of the screen display area of the display 101 may have a recess or an opening, and may include at least one of the audio module 114, the sensor module 104, the camera module 105, and the light emitting element 106, which are aligned with the recess or the opening. In some embodiments, at least one of the audio module 114, the sensor module 104, the camera module 105, the fingerprint sensor 116, and the light emitting element 106 may be included on the rear surface of the screen display area of the display 101. In some embodiments, the display 101 may be coupled to or be disposed to be adjacent to a touch detection circuit, a pressure sensor that may measure the strength (the pressure) of a touch, and/or a digitizer that detects a stylus pen of a magnetic field type. In some embodiments, at least a portion of the sensor modules 104 and 109 and/or at least a portion of the key input device 117 may be disposed in the first areas 110D and/or the second areas 110E.

The audio modules 103, 107, and 114 may include the microphone hole 103 and the speaker holes 107 and 114. A microphone for acquiring external sounds may be disposed in the microphone hole 103, and in some embodiments, a plurality of microphones may be disposed to detect the direction of a sound. The speaker holes 107 and 114 may include the external speaker hole 107 and the communication receiver hole 114. In some embodiments, the speaker holes 107 and 114 and the microphone hole 103 may be implemented by one hole or a speaker may be included while the speaker holes 107 and 114 are not employed (e.g., a piezoelectric speaker).

The sensor modules 104, 116, and 119 may generate an electrical signal or a data value corresponding to an operational state of the interior of the electronic device 100 or an environmental state of the outside. The sensor modules 104, 116, and 119, for example, may include the first sensor module 104 (e.g., a proximity sensor) and/or a second sensor module (e.g., a fingerprint sensor) disposed on the first surface 110A of the housing 110, and/or the third sensor module 119 (e.g., a heart rate monitor (HRM) sensor) and/or the fourth sensor module 116 (e.g., a fingerprint sensor) disposed on the second surface 110B of the housing 110. The fingerprint sensor may be disposed not only on the first surface 110A (e.g., the display 101) but also on the second surface 110B of the housing 110. The electronic device 100 may further include a sensor module, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illumination sensor 104.

The camera modules 105, 112, and 113 may include the first camera device 105 disposed on the first surface 110A of the electronic device 100, and the second camera device 112 and/or the flash 113 disposed on the second surface 110B. The camera devices 105 and 112 may include one or a plurality of lenses, an image sensor, and/or an image signal processor. The flash 113, for example, may include a light emitting diode or a xenon lamp. In some embodiments, two or more lenses (e.g., an infrared ray camera, and a wide angle/telephoto lens), and image sensors may be disposed on one surface of the electronic device 100.

The key input device 117 may be disposed on the side surface 110C of the housing 110. In some embodiments, the electronic device 100 may not include some or all of the above-mentioned key input devices 117 and the key input devices 117 which are not included, may be realized in different forms, such as a soft key, on the display 101. In some embodiments, the key input device may include the sensor module 116 disposed on the second surface 110B of the housing 110.

The light emitting element 106, for example, may be disposed on the first surface 110A of the housing 110. The light emitting element 106, for example, may provide state information on the electronic device 100 in the form of light. In some embodiments, the light emitting element 106, for example, may provide a light source that interworks with an operation of the camera module 105. The light emitting element 106, for example, may include a light emitting diode (LED), an infrared (IR) LED, and a xenon lamp.

The connector holes 108 and 109 may include the first connector hole 108 that may accommodate a connector (e.g., a USB connector) for transmitting and receiving electric power and/or data to and from an external electronic device and/or the second connector hole (e.g., an earphone jack) 109 that may accommodate a connector for transmitting and receiving an audio signal to and from the external device.

The pen input device 120 (e.g., a stylus pen) may be guided into the interior of the housing 110 through a hole 121 formed on the side surface of the housing 110 to be inserted or detached, and may include a button for easy attachment or detachment of the pen input device 120. A separate resonance circuit may be embedded in the pen input device 120 to interwork with an electromagnetic induction panel 390 (e.g., a digitizer) included in the electronic device 100. The pen input device 120 may include an electromagnetic resonance (EMR) scheme, an active electrical stylus (AES), and an electric coupled resonance (ECR) scheme.

Figure 2:
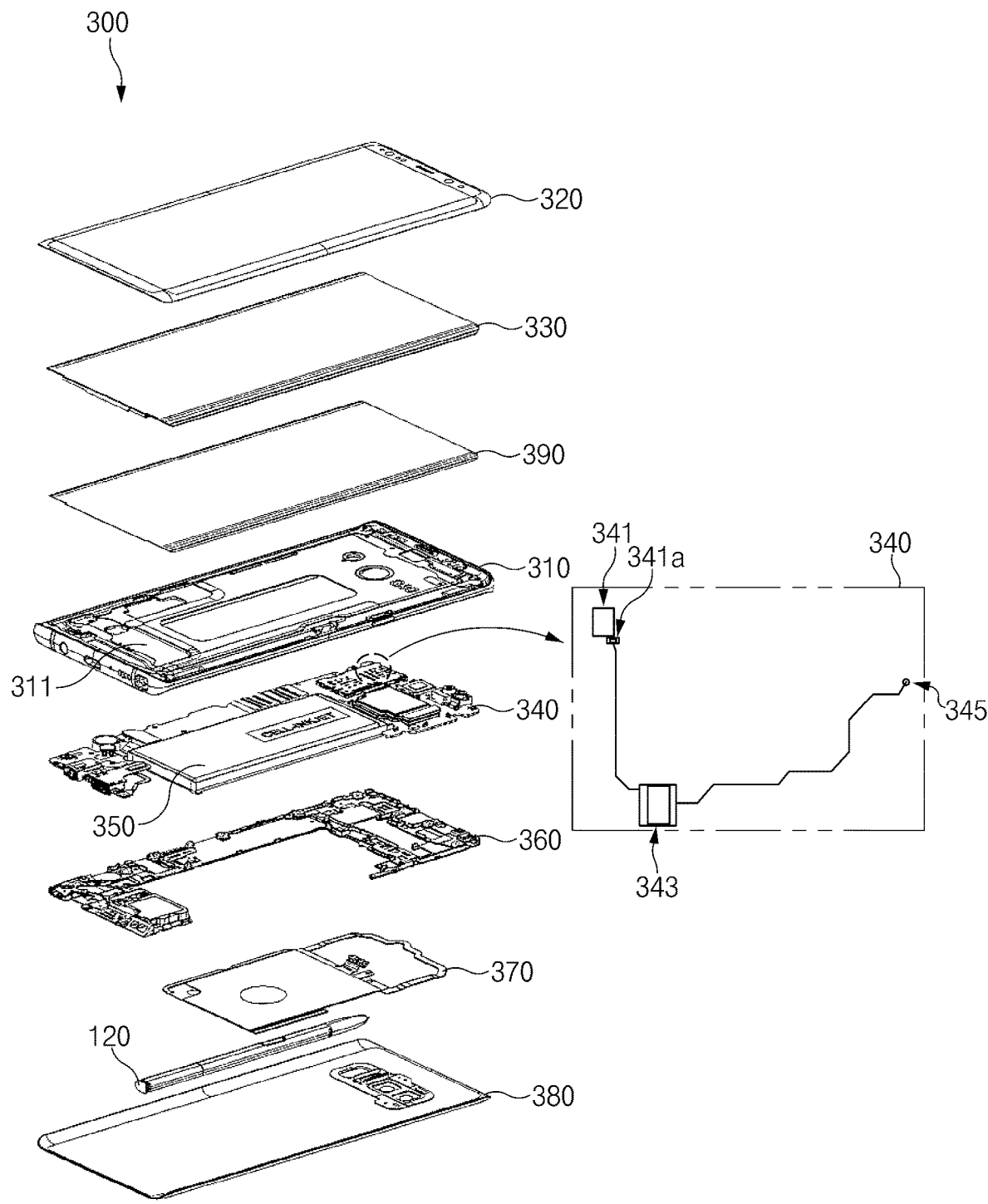
FIG. 2 illustrates an exploded perspective view of an electronic device according to an embodiment of the disclosure.

FIG. 2 illustrates an exploded perspective view of an electronic device according to an embodiment of the disclosure.

Referring to FIG. 2, an electronic device 300 may include a side bezel structure 310, a first support member 311 (e.g., a bracket), a front plate 320, a display 330, the electromagnetic induction panel 390, a printed circuit board 340, a battery 350, a second support member 360 (e.g., a rear case), an antenna 370, and a rear plate 380. In some embodiments, at least one (e.g., the first support member 311 or the second support member 360) of the components may be omitted from the electronic device 300 or another component may be additionally included in the electronic device 300. At least one of the components of the electronic device 300 may be the same as or similar to at least one of the components of the electronic device 100 of FIGS. 1A and 1B, and a repeated description thereof will be omitted.

The electromagnetic induction panel 390 (e.g., a digitizer) may be a panel for detecting an input by the pen input device 120. For example, the electromagnetic induction panel 390 may include a printed circuit board (e.g., a flexible printed circuit board) and a shield sheet. The shield sheet may prevent interferences between components by electromagnetic fields generated by the components (e.g., a display module, a printed circuit board, and an electromagnetic induction panel) included in the electronic device 100. The shield sheet may allow an input by the pen input device 120 to be accurately delivered to a coil included in the electromagnetic induction panel 240 by shielding the electromagnetic fields generated by the components. The electromagnetic induction panel 240 according to various embodiments may include an opening formed at least a partial area corresponding to a biometric sensor mounted on the electronic device 100.

The first support member 311 may be disposed in the interior of the electronic device 300 to be connected to the side bezel structure 310 or to be integrally formed with the side bezel structure 310. The first support member 311, for example, may be formed of a metallic material and/or a nonmetallic material (e.g., a polymer). The display 330 may be coupled to one surface of the first support member 311, and the printed circuit board 340 may be coupled to an opposite surface of the first support member 311. A processor, a memory, and/or an interface may be mounted on the printed circuit board 340. The processor, for example, may include one or more of a central processing unit, an application processor, a graphic processing device, an image signal processor, a sensor hub processor, or a communication processor.

The printed circuit board 340 may include at least one coupler. For example, a first coupler 341 and a second coupler 343 may be formed in an interior of the printed circuit board 340. The first coupler 341, for example, may be a configuration that couples wide band signals. For example, the wide band signals may include at least one signal of signals of, among various frequency bands supported by the electronic device 300, a plurality of frequency bands (e.g., low, middle, high, and sub6 frequency bands). According to an embodiment, an adjusting capacitor 341a (e.g., a shunt capacitor or a tunable capacitor) electrically connected to the first coupler 341 may be disposed on one side of the printed circuit board 340. The second coupler 343, for example, may be a configuration that couples any one of signals of the first frequency band or the second frequency band. For example, the low band may include a band of about 0.5 GHz to about 1 GHz, the high band may include a band of about 2 GHz to about 6 GHz, and the middle band may include a frequency band between the low band and the high band, for example, a band of about 1 GHz to about 2 GHz. The printed circuit board 340 may include a detection point 345 that detects signals coupled by the couplers 341 and 343. The detection point 345, for example, may be connected to a transceiver of the electronic device 300.

The memory, for example, may include a volatile and/or nonvolatile memory.

The interface, for example, may include a high definition multimedia interface (HDMI), a universal serial bus (USB), an flash memory card interface, and/or an audio interface. The interface, for example, may electrically or physically connect the electronic device 300 to an external electronic device, and may include a USB connector, an flash memory card/MultiMediaCard (MMC) connector, and an audio connector.

The battery 350 may be a device for supplying electric power to at least one component of the electronic device 300, and for example, may include a primary battery that cannot be recharged, a secondary battery that may be recharged, and/or a fuel cell. At least a portion of the battery 350, for example, may be disposed on substantially the same plane as the printed circuit board 340. The battery 350 may be integrally disposed in the interior of the electronic device 300, and may be disposed to be detachable from the electronic device 300.

The antenna 370 may be disposed between the rear plate 380 and the battery 350. The antenna 370, for example, may include a near field communication (NFC) antenna, a wireless charging antenna, and/or a magnetic secure transmission (MST) antenna. The antenna 370, for example, may perform short-range communication with an external device, or may wirelessly transmit and receive electric power that is necessary for charging. In another embodiment, an antenna structure may be defined by some of the side bezel structure 310 and/or the first support member 311, or a combination thereof.

Figure 3:
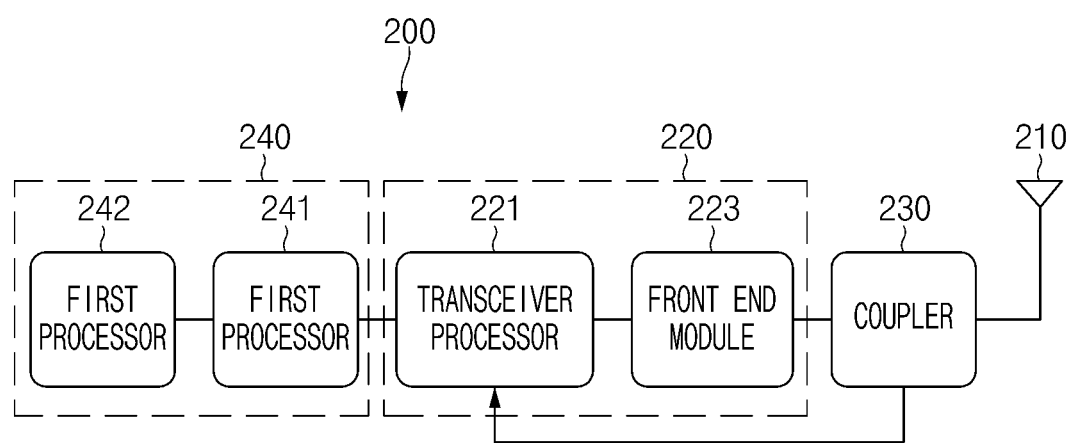
FIG. 3 is a block diagram illustrating an antenna 210, a wireless communication circuit 220, and peripheral devices thereof included in an electronic device 200 (e.g., an electronic device 101 of FIGS. 1A and 1B or an electronic device 300 of FIG. 2) according to various embodiments of the disclosure.

FIG. 3 is a block diagram illustrating an antenna 210, a wireless communication circuit 220, and peripheral devices thereof included in an electronic device 200 (e.g., the electronic device 101 of FIGS. 1A and 1B or the electronic device 300 of FIG. 2) according to various embodiments of the disclosure.

Referring to FIG. 3, the electronic device 200, for example, may include an entirety or a portion of the electronic device 101 illustrated in FIGS. 1A and 1B or the electronic device 300 illustrated in FIG. 2.

The electronic device 200 may include at least one antenna 210, the wireless communication circuit 220, a processor 240 (e.g., a first processor 242 and a second processor 241). The wireless communication circuit 220 may include a transceiver 221 and/or a front end module 223. The front end module 221 may include a configuration, such as a power amplifying module, a filter (a duplexer or a diplexer), or a switch. The power amplifying module may include a power amplifier or a low-noise amplifier. In some embodiments, the power amplifier may amplify an RF signal (e.g., a Tx signal) received from the transceiver 221 and transmit the RF signal to the front end module 223. In some embodiments, the low-noise amplifier may amplify an RF signal (e.g., an Rx signal) received from the at least one antenna 210 through the front end module 223 while decreasing noise therein, and may transmit the amplified RF signal to the transceiver 221. In some embodiments, an amplification rate of the power amplifier or the low-noise amplifier may be determined by a magnitude of an energy source (e.g., a voltage or a current) thereof. In some embodiments, the amplification rate may be changed by adjusting the magnitude of the power source (the voltage or the current) by the processor 240.

The transceiver 221 may convert data received from the processor 240 to an RF signal (e.g., a transmission (Tx) signal) and output the RF signal to the front end module 223. In some embodiments, the transceiver 221 may convert the RF signal (e.g., a reception (Rx) signal) received from the front end module 223 to digital data that may be decoded by the processor 240 and deliver the digital data to the processor 240.

The front end module 223 may function to distribute electric power to two or more antennas. As an example, the front end module 223 may divide signals. The front end module 223 may separate transmission/reception signals and output them. In some embodiments, the front end module 223 may amplify the RF signal (e.g., the Tx signal) received from the transceiver 221 and output the RF signal to the at least one antenna 210, and may filer the RF signal (e.g., the Rx signal) received from the at least one antenna 210, low-noise amplify the filtered RF signal, and then output the amplified RF signal to the transceiver 221.

A coupler 230 may perform power extraction or coupling. For example, the coupler 230 may extract a coupling signal having electric power (e.g., about 30 dBm when the electric power of the RF signal is 'about 0 dBm') that has the same waveform but is lower than the electric power of the RF signal from the RF signal output from the at least one antenna 210, and transmit the coupling signal to the transceiver 221.

A load impedance may be disposed between the at least one antenna 210 and the coupler 230, and the load impedance may have a specific difference from a characteristic impedance of the coupler 230. In some embodiments, although not illustrated in the drawings, an impedance tuning circuit (e.g., a matching circuit) that adjusts the load impedance such that the load impedance becomes closest to the characteristic impedance may be additionally included.

The processor 240 may include a second processor (e.g., an application processor (AP)), or the first processor 241 (e.g., a communication processor (CP)). The processor 240, for example, may execute operations or data processing related to the control and/or communication of at least one other component of the electronic device 200. The processor 240 may be electrically connected to other components (e.g., the transceiver 221 and/or the coupler 230) for controls, and may process and calculate various data.

The electronic device 200 may further include a memory that is operatively connected to the processor 240, and the memory may be electrically connected to other components (e.g., the transceiver 221 and/or the coupler 230) to store instructions which, when executed, cause the processor to control the components and process and calculate various data. In some embodiments, the memory may store a compensation value for adjusting the load impedance such that the load impedance becomes closest to the characteristic impedance.

The processor 240 may calculate a reflection efficiency of the antenna 210 by using values corresponding to the coupling signal received from the transceiver 221 and acquire a phase value. The processor 240 may obtain a phase difference (e.g., a phase difference from a reference set) by comparing the acquired phase value, for example, with a reference value (reference phase information) recorded in a lookup table stored in the memory. The phase difference (e.g., an RF performance deviation from the reference set) may be compensated for.

Figure 4D:
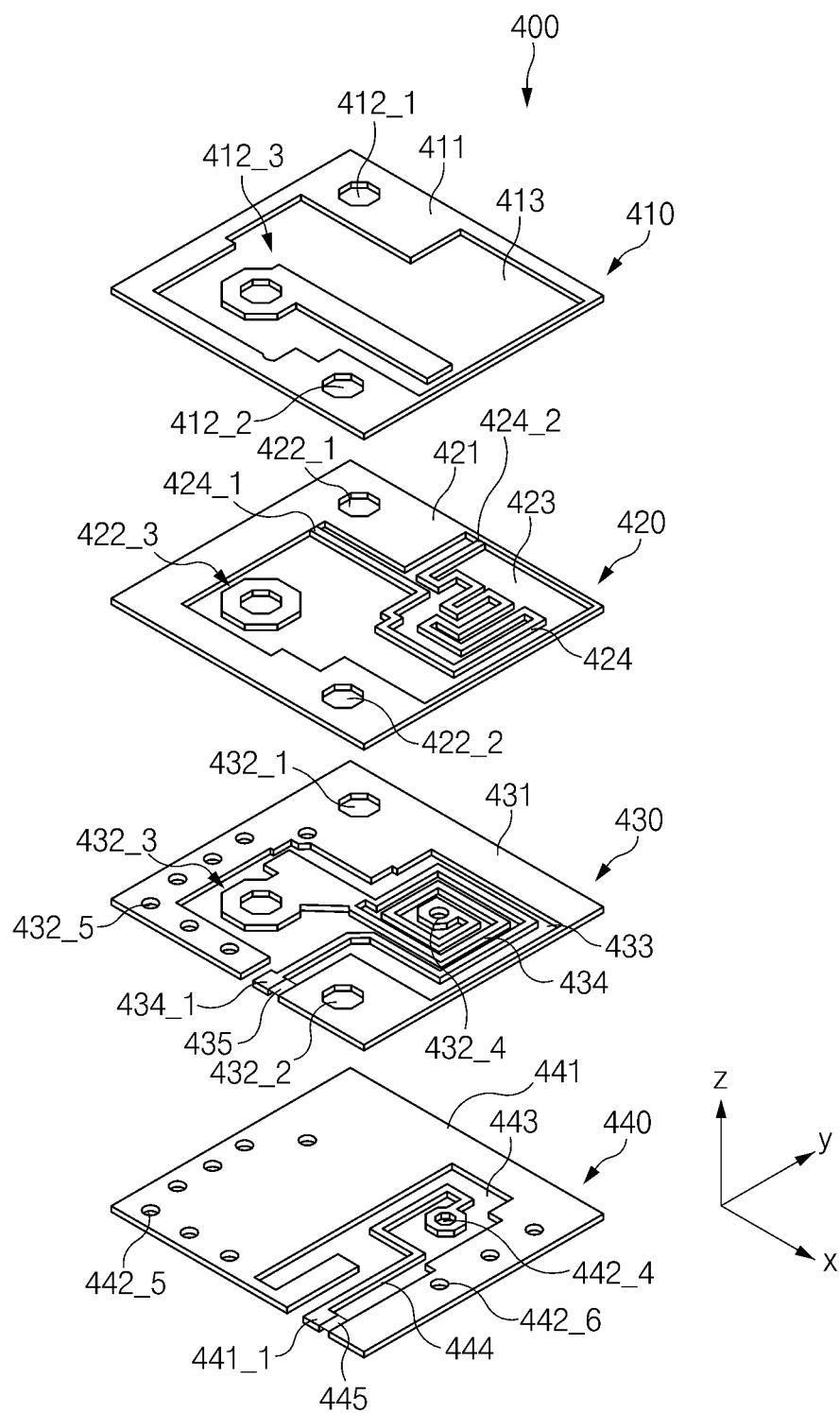
FIG. 4D illustrates an exploded perspective view of a coupler 400 embedded in a printed circuit board according to an embodiment of the disclosure.

FIGS. 4A, 4B, and 4C are views illustrating structures of the coupler 400 embedded in the printed circuit board according to an embodiment of the disclosure. FIG. 4A is a view illustrating front surfaces (e.g., a surface that faces the z axis direction) of the layers included in the coupler 400. FIG. 4B illustrates a perspective view of a state, in which the layers as seen in FIG. 4A are coupled to each other. FIG. 4C is a view illustrating an equivalent circuit of that which is seen in FIG. 4B. FIG. 4D illustrates an exploded perspective view of the coupler 400 embedded in the printed circuit board according to an embodiment of the disclosure. Referring to FIG. 4C, the coupler 400 may have a circuitry structure, in which at least one inductor having an inductance of a first magnitude is disposed between a first line port 424-1 and a second line port 424-2 and at least one inductor having a second inductance and at least one capacitor having a first capacitance are disposed between a coupling port 434-1 (or a connection port, a detection port, or a signal detection port) and a terminal port 441-1.

Referring to FIGS. 4A through 4D, at least a portion of the coupler 400 may have a form, in which it is embedded in the printed circuit board (e.g., the printed circuit board 340 of FIG. 2). An aspect that the coupler 400 is embedded in the printed circuit board may include a concept that at least some of the components included in the coupler 400 constitute at least a portion of the printed circuit board PCB. Furthermore, an aspect that the coupler 400 is embedded in the printed circuit board, as another example, may include a concept that the printed circuit board has a function of the coupler 400. FIGS. 4A through 4D are views illustrating only a part of the printed circuit board, in which the coupler 400 is included, and in which other parts are omitted.

The printed circuit board, in which the coupler 400 is embedded, for example, may include a first layer 410, a second layer 420, a third layer 430, and/or a fourth layer 440. According to an embodiment, the coupler 400 embedded in the printed circuit board 340 may have the illustrated shape while being formed in at least a partial area of the printed circuit board 340, but the shapes of the layers 410, 420, 430, and 440 included in the coupler 400 are not limited to specific shapes (e.g., a four-sided shape) as illustrated. For example, areas (e.g., 411, 421, 431, and 441) of the printed circuit board 340, which define the coupler 400, may not have the illustrated outer shapes but may have various shapes. According to various embodiments, it is illustrated in the illustrated drawings that the overall sizes and overall shapes of the layers 410, 420, 430, and 440 of the coupler 400 are the same or similar, but at least portions of the layers 410, 420, 430, and 440, for example, at least portions of the overall sizes and shapes of the conductive parts may be formed differently.

In some embodiments, the first layer 410 may include at least conductive part. For example, the first layer 410 may include the first conductive part 411, a first opening 413, and/or a first conductive flat plate 412_3, which are formed of a conductor (or a conductive member).

In some embodiments, the first conductive part 411 may have a polygonal (e.g., a four-sided) (or elliptical) shape that surrounds the first opening 413 formed on an inner side thereof when viewed in the z axis direction. One or more conductive via holes 412_1 and 412_3 for electrical connection to another layer (e.g., the second layer 420) may be formed in the first conductive part 411. According to an embodiment, at least one first opening 413 (or a fill-cut section) may be formed in the first layer 410. An insulator may be filled in the at least one first opening 413.

In some embodiments, the first conductive flat plate 412_3 may be disposed at at least a portion of an area of the first opening 413 inside the first conductive part 411. The first conductive flat plate 412_3, for example, may include a first via hole 412_3a for electrical connection to the conductive flat plates 422_3 and 432_3 formed in another layer (e.g., the second layer 420 of the third layer 430), a first hole periphery part 412_3b that defines the first via hole 412_3a, and a first extension part 412_3c that extends from the first hole periphery part 412_3a while having a specific width in one direction (e.g., the x axis direction). The first via hole 412_3b, for example, may have a polygonal or circular hole shape that passes in the negative z axis direction (or the vertical direction) in the z axis. The first hole periphery part 412_3a may have a structure that has the first via hole 412_3b in an interior thereof. The first hole periphery part 412_3a is not limited to the illustrated shape, but for example, may have a ring shape. The first conductive flat plate 412_3 may be electrically isolated from the first conductive part 411 by at least a portion of the first opening 413. At least a portion of a conductive part (e.g., the first conductive part 411 or the first conductive flat plate 412_3) included in the above-described first layer 410 may be coupled to at least a portion of a conductive part (e.g., the third conductive part 431 and a first conductive pattern 434 connected to a coupling port 434_1) of the third layer 430. For example, at least a portion of the first conductive flat plate 412_3 of the first layer 410 and the first conductive pattern 434 of the third layer 430 may be coupled to a first RF signal transmission line 424 formed in the second layer 420. In some embodiments, the first conductive flat plate 412_3 may enhance a stability of coupling of the first conductive pattern 434 of the third layer 430 and the first RF signal transmission line 424. For example, at least a portion of the first extension part 412_3c may be similar to a conductive plate included in a capacitor.

In some embodiments, the second layer 420 may be disposed to be adjacent to a lower side of the first layer 410 with respect to the first direction (e.g., a direction that faces the z axis of FIG. 4B). The second layer 420, for example, may include the second conductive part 421, a second opening 423, the first RF signal transmission line 424, or the second conductive flat plate 422_3, which are formed of a conductor.

In some embodiments, the second conductive part 421 may be formed to surround the second opening 423 similarly to the first conductive part 411. At least one conductive via hole 422_1 and 422_2 that is used for electrical connection to another layer (e.g., the first layer 410 and/or the fourth layer 440) may be formed in the second conductive part 421. The second opening 423 may be a specific space of the second conductive part 421. An insulator may be disposed at at least a portion of the second opening 423. The first RF signal transmission line 424 and the second conductive flat plate 422_3, for example, may be disposed in the second opening 423.

In some embodiments, the second conductive flat plate 422_3 may be electrically isolated from the first RF signal transmission line 424 and the second conductive part 421 by at least a portion of the second opening 423. For example, the first RF signal transmission line 424 may be disposed on one side of an interior of the second opening 423. The first RF signal transmission line 424, for example, may include a first line port 424_1, a second line port 424_2, and a first transmission line 424_3 that connects the first line port 424_1 and the second line port 424_2. The first line port 424_1 may be used as an input port, to which a signal of the transceiver 221 is input, and the second line port 424_2 may be used as an output port, from which a signal of the transceiver 221 is output. The first transmission line 424_3 may have a length for coupling of the coupler 400, and thus damping of the RF signal may be decreased. As another example, a length of the first transmission line 424_3 may be designed according to a frequency band that is targeted by the coupler 400. In some embodiments, the first transmission line 424_3 may include at least one curved part (or a plurality of inflection points) to have a specific length in relation to transmission of the signal of the first frequency band. For example, the first transmission line 424_3 may include a plurality of convexo-concaves while extending from a portion that is adjacent to one side (e.g., a periphery in the negative x axis) of the second conductive part 421 to a portion that is adjacent to an opposite side (e.g., a periphery in they axis). In some embodiments, the coupler 400 may further include at least one via hole or an additional wiring line in relation to connections between the first line port 424_1 and the second line port 424_2, and the transceiver 221 and the antenna 210.

In some embodiments, the second conductive flat plate 422_3 may be electrically connected to the first conductive flat plate 412_3 disposed in the first layer 410 and the third conductive flat plate 432_3 disposed in the third layer 430. In an embodiment, the second conductive flat plate 422_3 may include a second via hole 422_3b and/or a second hole periphery part 422_3a that defines the second via hole 422_3b. The second via hole 422_3b, for example, may have a shape that is the same as or similar to that of the first via hole 412_3b. The second hole periphery part 422_3a may have a shape that is the same or similar to that of the first hole periphery part 412_3a. The second conductive flat plate 422_3 may be disposed to be spaced apart from the first conductive flat plate 412_3 by a specific interval in the z axis direction. An insulating material or an insulating member may be disposed between the second conductive flat plate 422_3 and the first conductive flat plate 412_3. The coupler 400 may further include a conductive member that connects the second via hole 422_3b of the second conductive flat plate 422_3 and the first via hole 412_3b of the first conductive flat plate 412_3.

In some embodiments, the third layer 430 may be disposed (e.g., disposed on a lower side of the second layer 420) to be adjacent to the second layer 420 with respect to the first direction (e.g., a direction that faces the z axis). The third layer 430, for example, may include the third conductive part 431, a third opening 433 (or a fill-cut area), the third conductive flat plate 432_3, or the first conductive pattern 434, which are formed of a conductor.

In some embodiments, the third conductive part 431 may be formed to surround the third opening 433 similarly to the first conductive part 411 or the second conductive part 421. One or more conductive via holes 432_1 and 432_2 used for electrical connection to another layer (e.g., the second layer 420) may be formed in the third conductive part 431. At least one conductive via hole 432_5 (e.g., a laser via hole) used for electrical connection to another layer (e.g., the fourth layer 440) may be formed in the third conductive part 431. A first opening area 431a may be formed in the third conductive part 431. The coupling port 434_1 that extends from the first conductive pattern 434 may be formed in the first opening area 431a. The third opening 433 may be connected to the first opening area 431a. For example, the third opening 433 may include the first opening area 431a.

In some embodiments, the third opening 433 may be formed as a specific space inside the third conductive part 431. An insulator may be disposed at at least a portion of the third opening 433. The third conductive flat plate 432_3 and the first conductive pattern 434 may be disposed in the third opening 433. The third conductive flat plate 432_3 and the first conductive pattern 434 may be electrically isolated from the third conductive part 431 through at least a portion of the third opening 433.

In some embodiments, the third conductive flat plate 432_3 may be electrically connected to the second conductive flat plate 422_3 disposed in the second layer 420. The third conductive flat plate 432_3 may include a third via hole 432_3b, a third hole periphery part 432_3a, or a second extension part 432_3c connected to the first conductive pattern 434. The third via hole 432_3b, for example, may have a shape that is the same as or similar to that of the first via hole 412_3b or the second via hole 422_3b. The third hole periphery part 432_3a may have a shape that is the same or similar to that of the first hole periphery part 412_3a or the second hole periphery part 322_3a. The second extension part 432_3c may extend from one side of the third hole periphery part 432_3a while having a specific surface, for example, in the y axis direction. The second extension part 432_3c, for example, may have a form, in which an area thereof becomes gradually larger as it becomes farther from the third hole periphery part 432_3a. The third conductive flat plate 432_3 may be disposed to be spaced apart from the second conductive flat plate 422_3 by a specific interval in the z axis direction. An insulating material or an insulating member may be disposed between the third conductive flat plate 432_3 and the second conductive flat plate 422_3. The third conductive flat plate 432_3 may be electrically connected to the second conductive flat plate 422_3 through the third via hole 432_3band the second via hole 422_3b. The coupler 400 may further include a conductive member that connects the third via hole 432_3b of the third conductive flat plate 432_3 and the second via hole 422_3b of the second conductive flat plate 422_3.

In some embodiments, the third conductive flat plate 432_3 may be electrically connected to the first conductive pattern 434. The first conductive pattern 434 may be electrically connected to the third conductive flat plate 432_3, and include a first pattern via hole 432_4 used for electrical connection to a first coiling portion 434a (or the first conductive line or the first inductor line), a second coiling portion 434b (or the second conductive line or the second inductor line), or the second conductive pattern 434 disposed in the fourth layer 440. At least a portion of the first conductive pattern 434 may function as an embedded inductor. At least a portion of the first conductive pattern 434 may be electrically connected to the first conductive flat plate 432_3 of the first layer 410 through a via hole (e.g., the first via hole 412_3b or the third via hole 432_3b), and may implement a coupling operation for the first RF signal transmission line 424 through the first coiling portion 434a or the second coiling portion 434b. The first coiling portion 434a, for example, may have a shape (or a line having at least one inflection point, a line, at least a portion of which includes a curve, or a line, at least a portion of which has a corner due to bending), one side of which is connected to one side of the second extension part 432_3c of the third conductive flat plate 432_3 and which is coiled by at least one turn. The first pattern via hole 432_4 may be disposed on an opposite side of the first coiling portion 434a. The second coiling portion 434b may be electrically connected to an opposite side (e.g., a portion that is adjacent to a portion, to which one side of the first coiling portion 434a is connected) of the second extension part 432_3c, and may have a line having at least one inflection point, a line, at least a portion of which has a curved shape, a line including at least one corner according at least one bending, or a shape having at least one turn and coiled in a direction that is substantially the same as that of the first coiling portion 434a. For example, the second coiling portion 434b may be disposed to surround at least a portion of an outskirt of the first coiling portion 434a. For example, the first coiling portion 434a may have turns, the number of which is larger than that of the second coiling portion 434b. One end (an end of a periphery of a wiring line disposed in the negative y axis direction) of the second coiling portion 434b may be connected to coupling port 434-1. In an embodiment, a first adhesion member 435 may be disposed between the coupling port 434_1 and the third conductive part 431 to prevent movement of the coupling port 434_1.

In some embodiments, the fourth layer 440 may be disposed (e.g., disposed on a lower side of the third layer 430) to be adjacent to the third layer 430 with respect to the first direction (e.g., a direction that faces the z axis direction), and may include a fourth conductive part 441, a fourth opening 443 (or a fill-cut area), or a second conductive pattern 444 (or a conductive line).

In some embodiments, the fourth conductive part 441 may include at least one via hole 442_5 (e.g., a laser via) used for electrical connection to the third conductive part 431 of the third layer 430, and may include at least one via hole 442_6 (e.g., a laser via) used for electrical connection to another layer (e.g., a ground layer) of the printed circuit board 340 or other configurations mounted on the printed circuit board 340. The fourth conductive part 441 may be disposed to surround at least a portion of the fourth opening 443. A second opening area 441a included in the fourth opening 443 may be formed on one side (e.g., one side of a periphery in the negative y axis) of the fourth conductive part 441. The fourth opening 443 may be formed on one area of the fourth conductive part 441, and an interior thereof may be empty. An insulator may be disposed at at least a portion of the fourth opening 443. The second conductive pattern 444 may be disposed in the fourth opening 443. The second conductive pattern 444 may be electrically isolated from the fourth conductive part 441 through at least a portion of the fourth opening 443. A size of the fourth conductive part 441 may be larger than that of an area of the fourth opening 443. A second pattern via hole 442_4 used for electrical connection to the first pattern via hole 432_4 formed in the third layer 430 may be formed on one side of the second conductive pattern 444. The second conductive pattern 444 may include a conductive line, a starting point of which is the second pattern via hole 442_4 and which extends to a periphery (e.g., a periphery in the negative y axis direction) of one side of the fourth conductive part 441.

In some embodiments, a terminal port 441_1 may be disposed at an end of the second conductive pattern 444 in the negative y axis direction. In an embodiment, another coupler or a terminal resistor (e.g., 50 Ohm) may be connected to the terminal port 441_1. The terminal resistor, for example, may be disposed in another area of the printed circuit board 340, which is adjacent to the coupler 400. The fourth layer 440 is a layer for securing isolation, and may be used for connecting the terminal port 441_1 to another coupler or a terminal resistor. A second adhesion member 445 may be disposed between the terminal port 441_1 and the fourth conductive part 441 to prevent movement of the terminal port 441_1.

In some embodiments, although not illustrated, an insulator may be disposed at at least a portion between the first to fourth layers 410 to 440. For example, in the coupler 400, a film having a high permittivity may be disposed between the first RF signal transmission line 424 and the first conductive flat plate 412_3 or between the first RF signal transmission line 424 and the third conductive flat plate 432_3 to secure a specific capacitance. The first opening 413 formed in the first layer 410 may be provided as a means for changing isolation characteristics when the first layer 410, the second layer 420, and/or the third layer 430 implements a capacitor. It may be advantageous to form the first opening 413 in the first layer 410 for adjustment of isolation as compared with an embodiment, in which the first opening 413 is not formed.

In some embodiments, at least some of the first opening 413, the second opening 423, the third opening 433, and the fourth opening 443 may overlap each other while maintaining a specific interval in the z axis direction. When viewed in the z axis direction, the first conductive flat plate 432_3, the second conductive flat plate 422_3, and the third conductive flat plate 432_3 may at least partially overlap each other. When viewed in the z axis direction, the first RF signal transmission line 424 and the first conductive flat plate 412_3 may at least partially overlap each other. When viewed in the z axis direction, the first RF signal transmission line 424 and the first conductive pattern 434 may at least partially overlap each other. When viewed in the z axis direction, the first RF signal transmission line 424 and the third conductive flat plate 432_3 may at least partially overlap each other.

Referring to FIG. 4C, in the coupler 400 of the disclosure, at least one inductance may be formed between the first line port 424_1 and the second line port 424_2 corresponding to opposite ends of the first RF signal transmission line 424, and at least one inductance and at least one capacitance may be formed between the coupling port 434_1 and the terminal port 441_1. In the coupler 400 according to an embodiment of the disclosure, a capacitance may be formed between at least a portion (e.g., the first extension part 412_3c) of the first conductive flat plate 432_3 of the first layer 410 and the first RF signal transmission line 424 and an inductance and a capacitance may be formed between the coupling port 434_1 and the terminal port 441_1 by the third conductive flat plate 432_3 and the first conductive pattern 434 of the third layer 430, between the first line port 424_1 and the second line port 424_2 to secure a specific coupling efficiency. The coupler 400 according to various embodiments of the disclosure, which has been described above, may be embedded in the printed circuit board 340 to enhance a spatial efficiency of the electronic device 200. Further, the coupler 400 having specific isolation characteristics in a state, it is embedded in the printed circuit board 340, may be provided.

Although it has been exemplified in the above description that the second layer 420 is disposed on a lower side of the first layer 410, the third layer 430 is disposed on a lower side of the second layer 420, and the fourth layer 440 is disposed on a lower side of the third layer 430, the embodiments of the disclosure are not limited thereto. For example, the coupler 400 may have a structure, in which the third layer 430 is disposed on a lower side of the fourth layer 440, the second layer 420 may be disposed on a lower side of the third layer 430, and the first layer 410 is disposed on a lower side of the second layer 420.

Figure 5A:
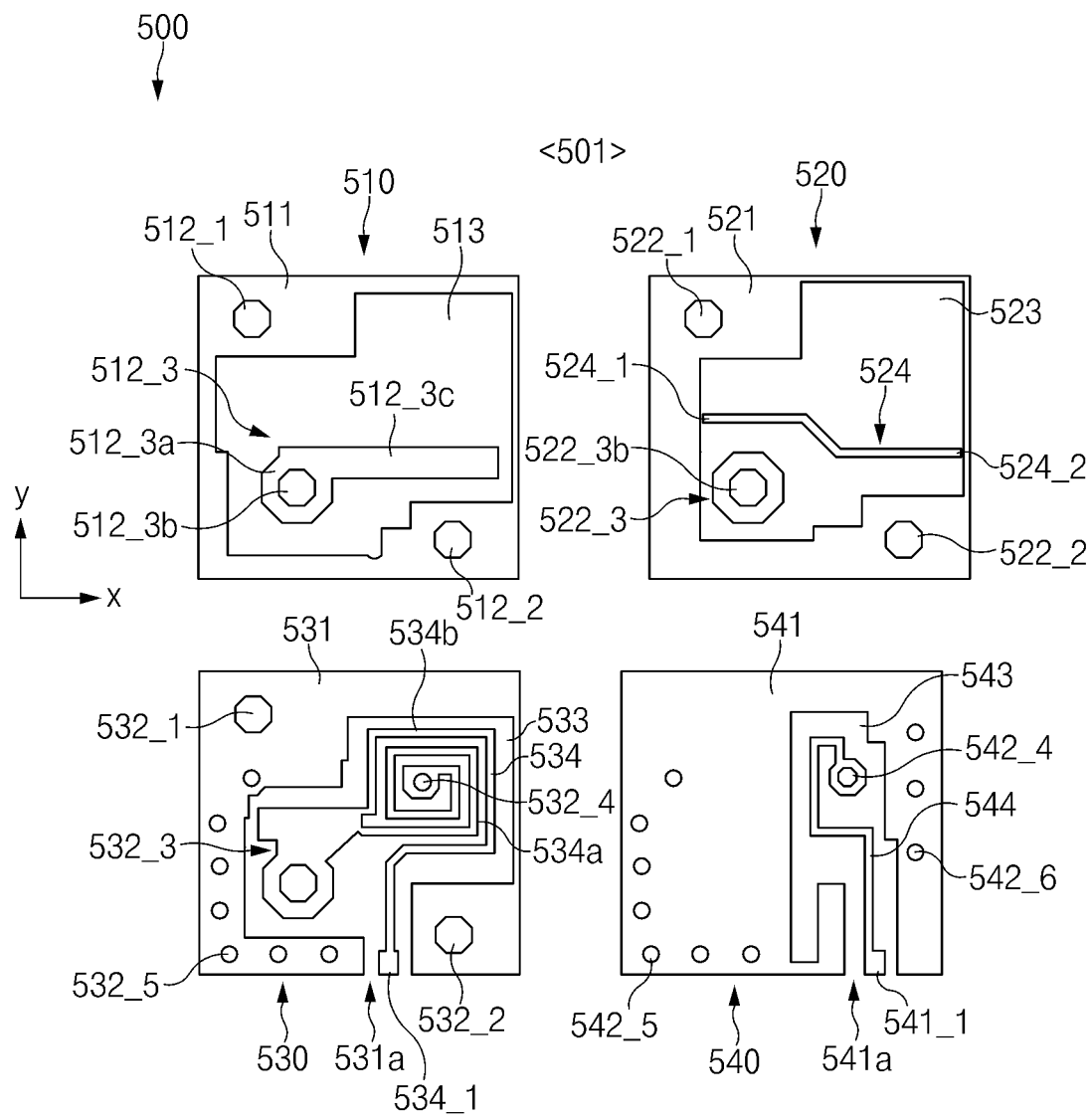
FIGS. 5A, 5B, and 5C are views illustrating structures of layers of a coupler 500 embedded in a printed circuit board according to an embodiment of the disclosure.
Figure 5B:
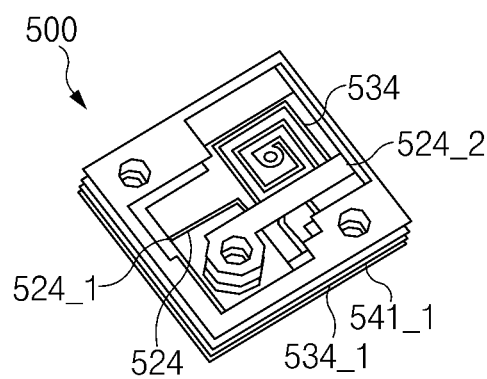
Figure 5C:
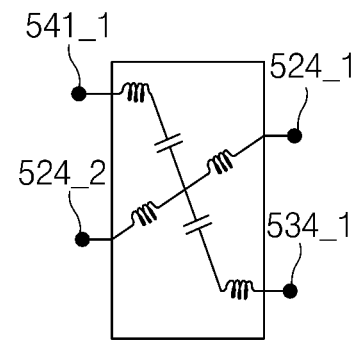
Figure 5D:
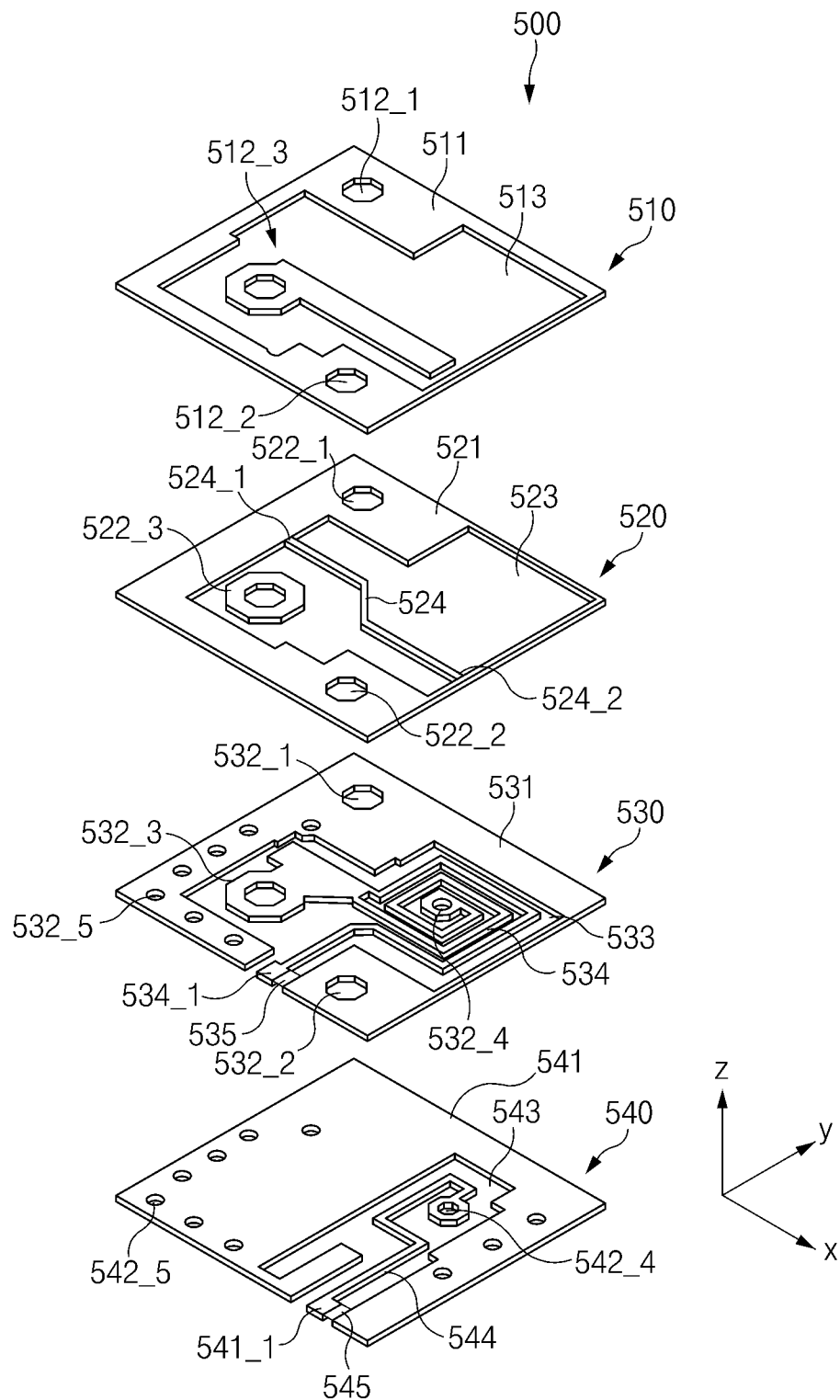
FIG. 5D is a view illustrating an example of an exploded perspective view of a coupler 500 embedded in a printed circuit board according to an embodiment of the disclosure.

FIGS. 5A, 5B, and 5C are views illustrating structures of layers of a coupler 500 embedded in a printed circuit board according to an embodiment of the disclosure. FIG. 5A is a view illustrating front surfaces (e.g., a surface that faces the z axis direction) of the layers. FIG. 5B illustrates a perspective view of a state, in which the layers illustrated as seen in FIG. 5A are coupled to each other. FIG. 5C is a view illustrating an equivalent circuit of that which is seen in FIG. 5B. FIG. 5D illustrates an exploded perspective view of the coupler 500 embedded in the printed circuit board according to an embodiment of the disclosure. Referring to FIG. 5C, the coupler 500 may have a circuitry structure, in which at least one inductor having an inductance of a first magnitude is disposed between a third line port 524-1 and a fourth line port 524-2 and at least one inductor having a second inductance and at least one capacitor having a first capacitance are disposed between a coupling port 534-1 and a terminal port 541-1.

Referring to FIGS. 5A through 5D, at least a portion of the coupler 500 may have a form, in which it is embedded in the printed circuit board (e.g., the printed circuit board 340 of FIG. 2). The board, in which the coupler 500 is embedded, may be a printed circuit board, for example, a board including a first layer 510, a second layer 520, a third layer 530, and/or a fourth layer 540. In some embodiments, overall shapes or sizes of the layers 510, 520, 530, and 540 (or the conductive parts of the layers) included in the coupler 500 formed in the printed circuit board are not limited to the shapes of the illustrated drawings, and at least some of the shapes and sizes of the conductive parts of the at least some of the layers 510, 520, 530, and 540 may be different.

In some embodiments, the first layer 510 may have a configuration and a shape that are the same as or similar to those of the first layer 410 described above in FIGS. 4A through 4D. For example, the first layer 510 (e.g., the first layer 410 of FIGS. 4A to 4D) may include a first conductive part 511 (e.g., the first conductive part 411 of FIGS. 4A to 4D) formed of a conductive material or a conductive member, a first opening 513 (e.g., the first opening 413 of FIGS. 4A to 4D), which passes in the z axis direction in one area of the first conductive part 511 and at least a portion of which may be filled with an insulator, and a first conductive flat plate 512_3 (e.g., the first conductive flat plate 412_3) disposed in the first opening 513 and electrically isolated from the first conductive part 511. The first conductive part 511 may include at least one via hole 512_1 and 512_2. The first conductive flat plate 512_3 may include a first via hole 512_3b (e.g., the first layer 412_3b of FIGS. 4A to 4D), a first hole periphery part 512_3a (e.g., the first hole periphery part 412_3a of FIGS. 4A to 4D), and/or a first extension part 512_3c (e.g., the first extension part 412_3c of FIGS. 4A to 4D).

In some embodiments, the second layer 520 may have a configuration and a shape that are the same as or similar to those of the second layer 420 described above in FIGS. 4A to 4D, except to an RF signal transmission line. For example, the second layer 520 (e.g., the second layer 420 of FIGS. 4A to 4D) may include a second conductive part 521 (e.g., the second conductive part 421 of FIGS. 4A to 4D) formed of a conductor, a second opening 523 (e.g., the second opening 423 of FIGS. 4A to 4D) formed inside the second conductive part 521 and filled with an insulating material, a second RF signal transmission line 524 disposed in the second opening 523, or a second conductive flat plate 522_3 (e.g., the second conductive flat plate 422_3 of FIGS. 4A to 4D) disposed in the second opening 523 and electrically isolated from the second conductive part 521 and the second RF signal transmission line 524. A second via hole 552_3b may be formed on one side of the second conductive flat plate 522_3. The second conductive part 521 may include at least one via hole 522_1 and 522_2 used for electrical connection to the first conductive part 511.

In some embodiments, the second RF signal transmission line 524, for example, may include a line of a specific width and a specific length, which is disposed inside the second opening 523 and extends from a periphery of the second opening 523 in the x axis to a periphery thereof in the negative x axis. The second RF signal transmission line 524, for example, may have a length for transmitting a signal of a specific second frequency band. According to an embodiment, the second RF signal transmission line 524 may be used to transmit a signal of a high frequency band as compared with the first RF signal transmission line 424 described above in FIG. 4A. For example, the second RF signal transmission line 524 may have a length that is suitable for transmitting a signal of a middle frequency band, a high frequency band, or a sub6 frequency band (e.g., about 1.8 GHz to about 3.5 GHz) that is higher than that of a signal of a low frequency band (about 0.60 GHz to about 1 GHz) transmitted through the first RF signal transmission line 424 described in FIGS. 4A to 4C. In some embodiments, the length of the second RF signal transmission line 524 may be smaller than the length of the first RF signal transmission line 424 described in FIGS. 4A to 4C. The second RF signal transmission line 524, for example, may include a third line port 524_1, the fourth line port 524_2, and a line that connects the third line port 524_1 and the fourth line port 524_2. The third line port 524_1 may function as an input port, to which a signal of a specific frequency band is input, and the fourth line port 524_2 may function as an output port, from which a signal of a specific frequency band is output. At least a portion of the second RF signal transmission line 524 may be coupled to the first conductive flat plate 512_3 disposed in the first layer 510 and a third conductive flat plate 532_3 disposed in the third layer 530, and/or a first conductive pattern 534.

In some embodiments, the third layer 530 may have a configuration and a shape that are the same as or similar to those of the third layer 430 described above in FIGS. 4A to 4D. For example, the third layer 530 (e.g., the third layer 430 of FIGS. 4A to 4D) may include a third conductive part 531 (e.g., the third conductive part 431 of FIGS. 4A to 4D) formed of a conductive material or a conductor, a third opening 533 (or a fill-cut area) (e.g., the third opening 433 of FIGS. 4A to 4D), the third conductive flat plate 532_3 (e.g., the third conductive flat plate 432_3 of FIGS. 4A to 4D), and the first conductive pattern 534 (e.g., the first conductive pattern 432_3 of FIGS. 4A to 4D). The third conductive part 531 may include at least one via hole 532_1 and 532_2 used for electrical connection to the second conductive part 521. According to various embodiments, the third conductive part 531 may include at least one via hole 532_5 used for electrical connection to a fourth conductive part 541 of the fourth layer 540. The third opening 533 may include a first opening area 531a. The third opening 533 may be formed at at least a portion of an inside or the third conductive part 531, and may be filled with an insulating material. The third conductive flat plate 532_3 and the first conductive pattern 534, which are electrically isolated from the third conductive part 531, may be disposed inside the third opening 533. The third conductive flat plate 532_3 and the first conductive pattern 534 may be electrically connected to each other. The first conductive pattern 534 may include at least one coiling portion 534a and 534b (or at least one conductive line or at least one inductor line) (e.g., the coiling portions 434a and 434b of FIGS. 4A to 4D), and a first pattern via hole 532_4 used for electrical connection to a second pattern via hole 542_4 of the fourth layer 540 may be formed on one side of the coiling portion 534a and 534b. One end (e.g., an end of the first conductive pattern 534 disposed in the first opening area 531a) of the first conductive pattern 534 may be used as a coupling port 534_1. In an embodiment, a first adhesion member 535 of a nonconductive material may be disposed between at least a portion of the coupling port 534_1 and the third conductive part 531 to fix the coupling port 534_1.

In some embodiments, the fourth layer 540 may have a configuration and a shape that are the same as or similar to those of the fourth layer 440 described above in FIGS. 4A through 4D. For example, the fourth layer 540 (e.g., the fourth layer 440 of FIGS. 4A to 4D) may be disposed (disposed on a lower side of the third layer 530) to be adjacent to the third layer 530, and may include the fourth conductive part 541 (e.g., the fourth conductive part 441 of FIGS. 4A to 4D), a fourth opening 543 (or a fill-cut area) (e.g., the fourth opening 443 of FIG. 4), or a second conductive pattern 544 (a conductive line) (e.g., the second conductive pattern 444 of FIG. 4). The fourth conductive part 541 may include at least one via hole 542_5 used for electrical connection to the third conductive part 531 of the third layer 530, and may include at least one via hole 542_6 used for electrical connection to another layer (e.g., a ground layer) of the printed circuit board 340 or other configurations mounted on the printed circuit board 340. The fourth opening 543 may include a second opening area 541a, and a terminal port 544_1 formed at an end of one side of the second conductive pattern 544 may be disposed in the second opening area 541a. A second adhesion member 545 of a nonconductive material may be disposed between at least a portion of the terminal port 541_1 and the fourth conductive part 541. A second pattern via hole 542_4 used for electrical connection to the first conductive pattern 534 disposed in the third layer 530 may be formed at an end of one side of the second conductive pattern 544 disposed inside the fourth opening 543.

In the coupler 500 of the above-described structure, at least a portion of a signal transmitted through the second RF signal transmission line 524 may be induced and be transmitted to the transceiver 221 through the coupling port 534_1 of the first conductive pattern 534 while the first conductive flat plate 512_3 and the third conductive flat plate 532_3, and the first conductive pattern 534 spaced part from the second RF signal transmission line 524 by a specific interval are coupled to the second RF signal transmission line 524.

Figure 6D:
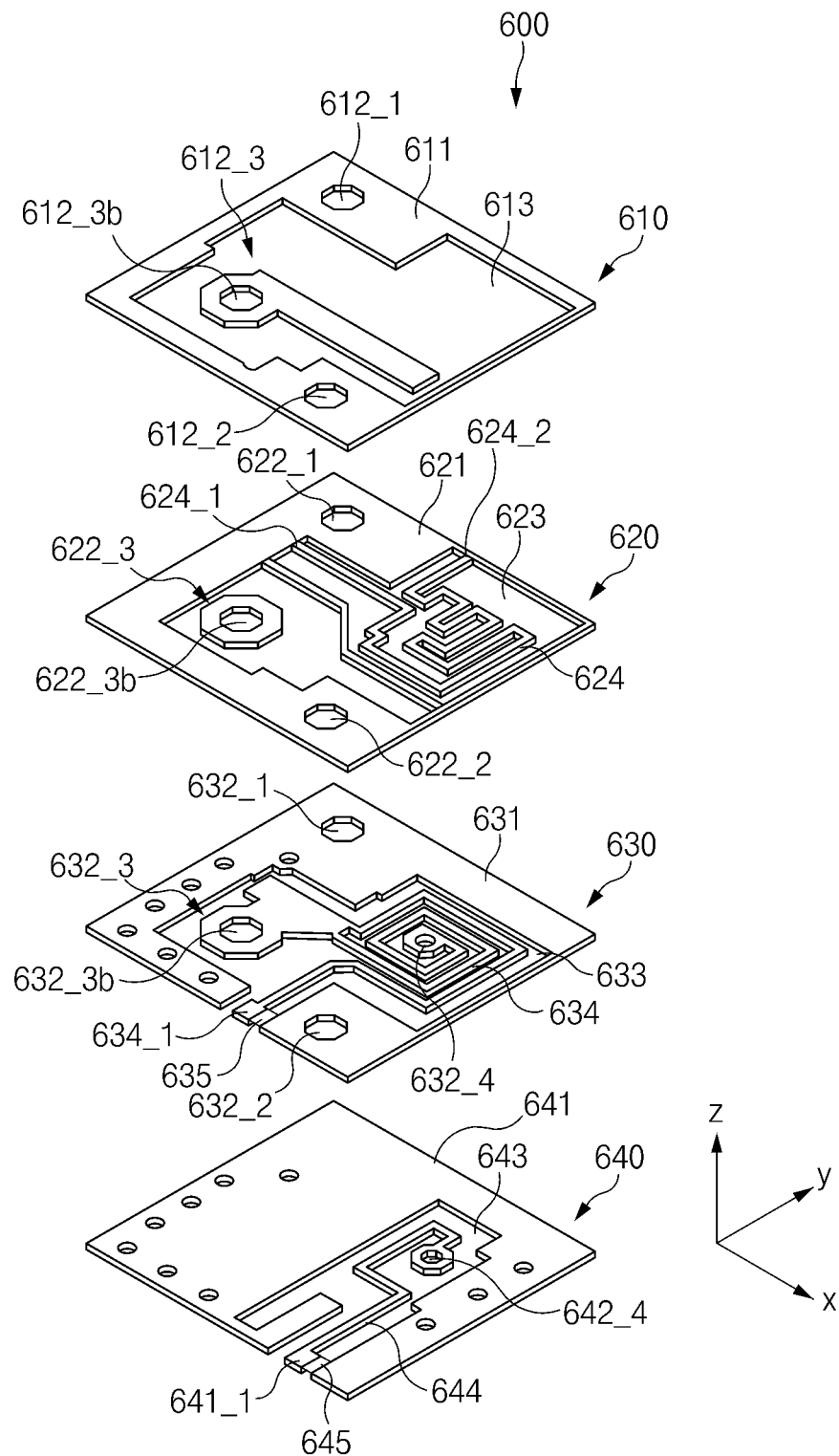
FIG. 6D illustrates an exploded perspective view of a coupler 600 embedded in a printed circuit board according to an embodiment of the disclosure.

FIGS. 6A, 6B, and 6C are views illustrating structures of layers of a coupler 600 embedded in a printed circuit board according to an embodiment of the disclosure. FIG. 6A is a view illustrating front surfaces (e.g., a surface that faces the z axis direction) of the layers. FIG. 6B illustrates a perspective view of a state, in which the layers illustrated as seen in FIG. 6A are coupled to each other. FIG. 6C is a view illustrating an equivalent circuit of that which is seen in FIG. 6B. FIG. 6D illustrates an exploded perspective view of the coupler 600 embedded in the printed circuit board according to an embodiment of the disclosure. Referring to FIG. 6C, the coupler 600 may have a circuitry structure, in which at least one inductor having an inductance of a first magnitude is disposed between a first line port 624-1 and a second line port 624-2, at least one inductor having an inductance of a second magnitude is disposed between the third line port 625_1 and the fourth line port 625_2, and at least one inductor having a second inductance and at least one capacitor having a first capacitance are disposed between a coupling port 634-1 and a terminal port 625-1.

Referring to FIGS. 6A to 6D, at least a portion of the coupler 600 may have a form, in which it is embedded in the printed circuit board (e.g., the printed circuit board 340 of FIG. 2). The printed circuit board, in which the coupler 600 is embedded, for example, may include a first layer 610, a second layer 620, a third layer 630, and/or a fourth layer 640. In some embodiments, overall shapes or sizes of the layers 610, 620, 630, and 640 (or the conductive parts of the layers) included in the coupler 600 formed in the printed circuit board are not limited to the shapes of the illustrated drawings, and at least some of the shapes and sizes of the conductive parts of the at least some of the layers 610, 620, 630, and 640 may be different.

In some embodiments, the first layer 610 may have a configuration and a shape that are the same as or similar to those of the first layer 410 described above in FIGS. 4A to 4D. For example, the first layer 610 (e.g., the first layer 410 of FIGS. 4A to 4D) may include a first conductive part 611 (e.g., the first conductive part 411 of FIGS. 4A to 4D) formed of a conductive material or a conductive member, a first opening 613 (e.g., the first opening 413 of FIGS. 4A to 4D), which passes in the z axis direction in the first conductive part 611 and at least a portion of which may be filled with an insulating material, and a first conductive flat plate 612_3 (e.g., the first conductive flat plate 412_3) disposed in the first opening 613 and electrically isolated from the first conductive part 611. The first conductive part 611 may include at least one via hole 612_1 and 612_2.

In some embodiments, the second layer 620 may have a configuration and a shape that are the same as or similar to those of the second layer 420 described above in FIGS. 4A to 4D, except to an RF signal transmission line. For example, the second layer 620 (e.g., the second layer 420 of FIGS. 4A to 4D) may include a second conductive part 621 (e.g., the second conductive part 421 of FIGS. 4A to 4D) formed of a conductor, a second opening 623 (e.g., the second opening 423 of FIGS. 4A to 4D), which is formed in the second conductive part 621 and at least a portion of which is filled with an insulating material, a first RF signal transmission line 624 and a second RF signal transmission line 625 disposed in the second opening 623, or a second conductive flat plate 622_3 (e.g., the second conductive flat plate 422_3 of FIGS. 4A to 4D) disposed in the second opening 623 and electrically isolated from the second conductive part 621, the first RF signal transmission line 624, and the second RF signal transmission line 625. The second conductive part 621 may include at least one via hole 622_1 and 622_2 used for electrical connection to the first conductive part 611.

In some embodiments, the first RF signal transmission line 624 may have a shape that is substantially the same as that of the first RF signal transmission line 424 described above in FIGS. 4A and 4B. For example, the first RF signal transmission line 624 may be disposed in the second opening 623, and may include a line that has a specific width and a specific length while extending from a periphery in the x axis to a periphery in the y axis of the second opening 623. For example, the first RF signal transmission line 624 may have a length for transmitting a signal of a specific first frequency band (e.g., a low frequency band (0.69 GHz to 1 GHz)). At least a portion of the first RF signal transmission line 624 may have a convexo-concave shape (or a convex-concave portion) to transmit the signal of the first frequency band. The first RF signal transmission line 624, for example, may include a first line port 624_1, a second line port 624_2, and a line that connects the first line port 624_1 and the second line port 624_2.

In some embodiments, the second RF signal transmission line 625 may have a shape that is substantially the same as that of the second RF signal transmission line 524 described above in FIGS. 5A through 5D. The second RF signal transmission line 625 may be disposed in the second opening 623 to be electrically isolated from the first RF signal transmission line 624, and may include a line that has a specific width and a specific length while extending from a periphery in the x axis and a periphery in the negative x axis of the second opening 623. The second RF signal transmission line 625 may have a length for transmitting a signal of a second frequency band (e.g., a middle frequency band, a high frequency band, or a sub6 frequency band (e.g., 1.8 to 3.5 GHz) that is higher than that of a signal of the first frequency band. According to an embodiment, the length of the second RF signal transmission line 625 may be smaller than the length of the first RF signal transmission line 624. The second RF signal transmission line 625, for example, may include a third line port 625_1, a fourth line port 625_2, and a line that connects the third line port 625_1 and the fourth line port 625_2.

In some embodiments, the third layer 630 may have a configuration and a shape that are the same as or similar to those of the third layer 430 described above in FIGS. 4A through 4D. The third layer 630, for example, may include a third conductive part 631, a third opening 633 (or a fill-cut area), a third conductive flat plate 632_3, or a first conductive pattern 634, which are formed of a conductive material or a conductor. The third conductive part 631 may include at least one via hole 632_1 and 632_2 used for electrical connection to the second conductive part 621. According to various embodiments, the third conductive part 631 may include at least one via hole 632_5 used for electrical connection to a fourth conductive part 641 of the fourth layer 640. The third opening 633 may include a first opening area 631a. The third conductive flat plate 632_3 may be electrically connected to the first conductive pattern 634, and the first conductive pattern 634 may include at least one coiling portion 634a and 634b (or at least one conductive liner or at least one inductor line). A first pattern via hole 632_4 used for electrical connection to a second pattern via hole 642_4 of the fourth layer 640 may be formed on one side of the coiling portion. An end of one side of the first conductive pattern 634 may be used as a coupling port 634_1. In an embodiment, a first adhesion member 635 of a nonconductive material may be disposed between at least a portion of the coupling port 634_1 and the third conductive part 631 to fix the coupling port 634_1.

In some embodiments, the fourth layer 640 may have a configuration and a shape that are the same as or similar to those of the fourth layer 440 described above in FIGS. 4A and 4B. For example, the fourth layer 640 may be disposed (e.g., disposed on a lower side of the third layer 630) to be adjacent to the third layer 630, and may include the fourth conductive part 641, a fourth opening 643 (or a fill-cut area), and a second conductive pattern 644 (or a conductive line). In some embodiments, the fourth conductive part 641 may include at least one via hole 642_5 used for electrical connection to the third conductive part 631 of the third layer 630, and may include at least one via hole 642_6 used for electrical connection to another layer (e.g., a ground layer) of the printed circuit board 340 or other configurations mounted on the printed circuit board 340. The fourth opening 643 may include a second opening area 641a. A terminal port 644_1 formed at an end of one side of the second conductive pattern 644 may be disposed in the second opening area 641a. A second adhesion member 645 of a nonconductive material may be disposed between at least a portion of the terminal port 641_1 and the fourth conductive part 641. A second pattern via hole 642_4 used for electrical connection to the first conductive pattern 634 disposed in the third layer 630 may be formed at an end of one side of the second conductive pattern 544 disposed inside the fourth opening 643.

The coupler 600 may selectively determine a connection path of the transceiver 221 and the antenna 210 according to a frequency band, which is to be output by the transceiver 221 through the antenna 210. For example, when the coupler 600 is used to couple a signal of a first frequency band, the first line port 624_1 or the first RF signal transmission line 624 of the coupler 600 may be connected to the transceiver 221, and the second line port 624_2 may be connected to the antenna 210. Furthermore, when the coupler 600 is used to couple a signal of a second frequency band, the third line port 625_1 or the second RF signal transmission line 625 of the coupler 600 may be connected to the transceiver 221, and the fourth line port 625_2 may be connected to the antenna 210. As described above, the coupler 600 helps any one of the first RF signal transmission line 624 or the second RF signal transmission line 625 to be selectively used according to a frequency band, to which a coupling operation is to be applied.

Figure 7A:
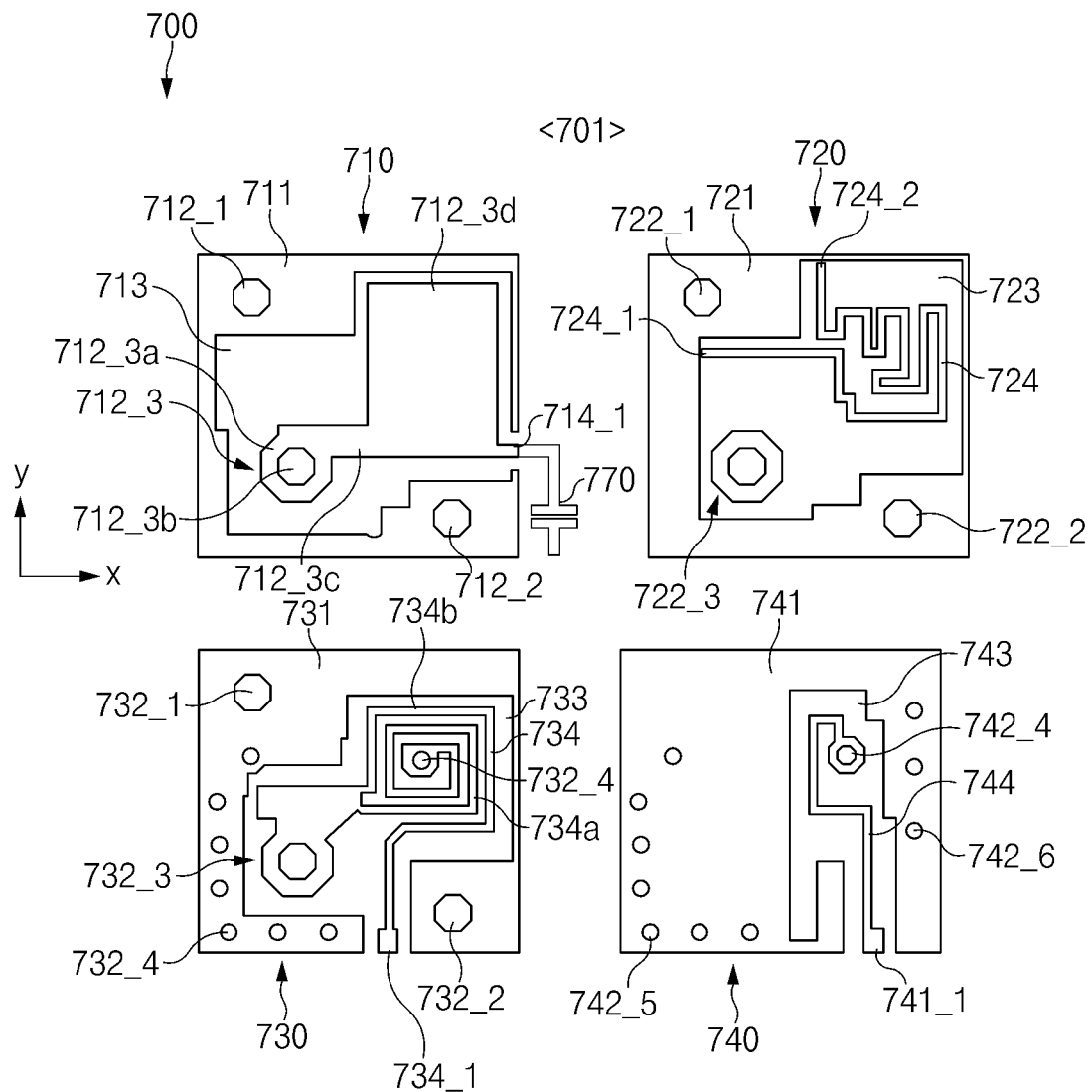
FIGS. 7A, 7B, and 7C are views illustrating structures of layers of a coupler 700 embedded in a printed circuit board according to an embodiment of the disclosure.
Figure 7B:
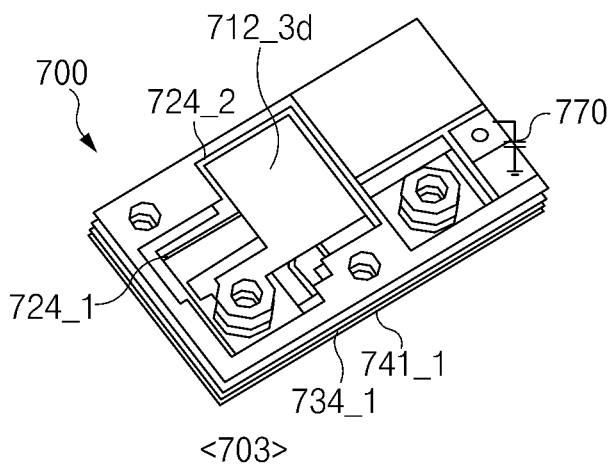
Figure 7C:
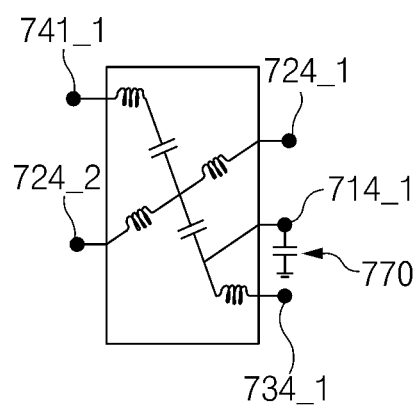
Figure 7D:
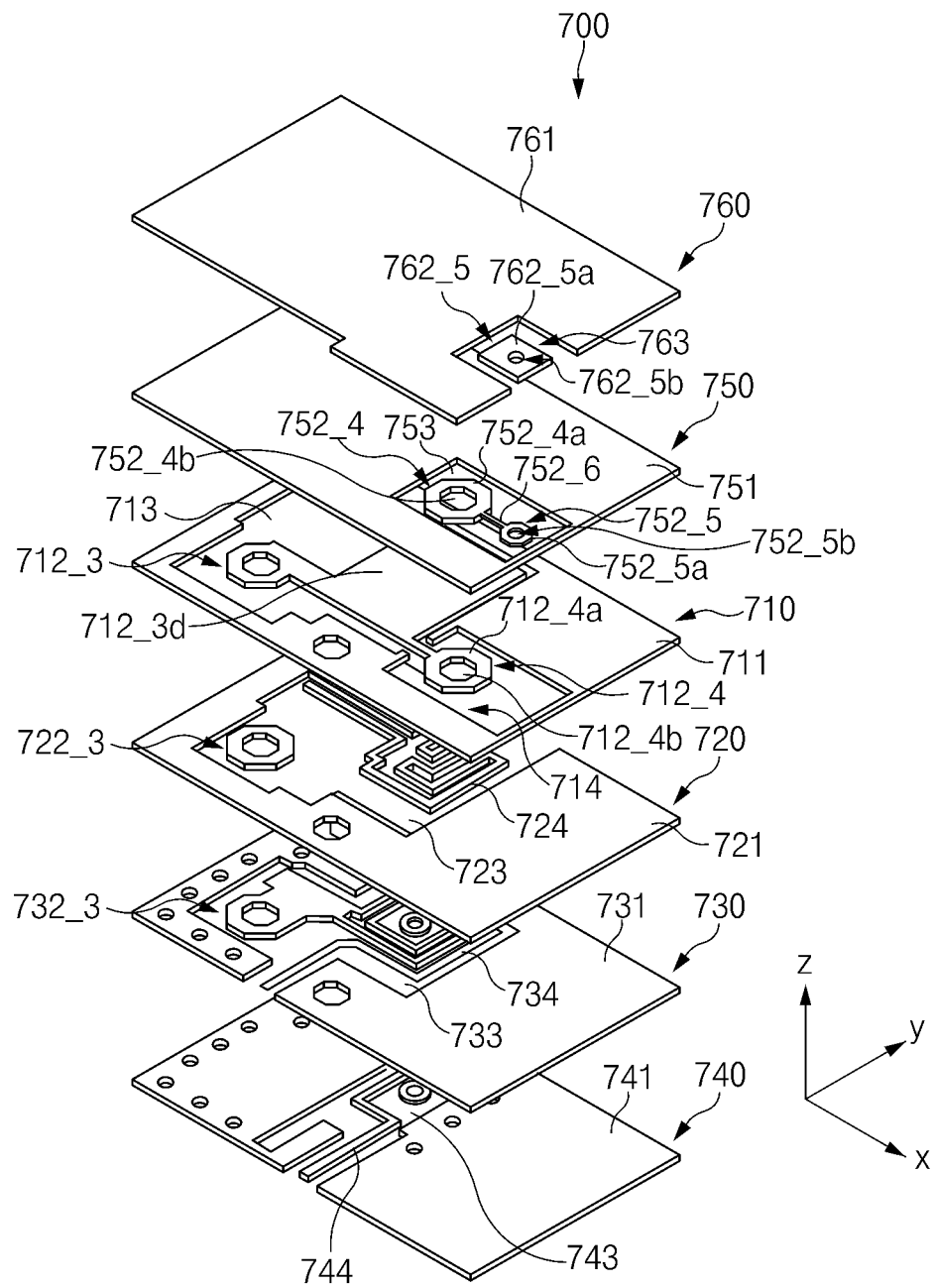
FIG. 7D illustrates an exploded perspective view of a coupler 700 embedded in a printed circuit board according to an embodiment of the disclosure.

FIGS. 7A to 7C are views illustrating structures of layers of a coupler 700 embedded in the printed circuit board according to an embodiment of the disclosure. FIG. 7A is a view illustrating front surfaces (e.g., a surface that faces the z axis direction) of the layers included in the structure of the coupler 700. FIG. 7B illustrates a perspective view of a state, in which the layers illustrated as seen in FIG. 7A are coupled to each other. FIG. 7C is a view illustrating an equivalent circuit of that which is seen in FIG. 7B. FIG. 7D illustrates an exploded perspective view of the coupler 700 embedded in the printed circuit board according to an embodiment of the disclosure. Referring to FIG. 7C, the coupler 700 may have a structure, in which at least one inductor having an inductance of a first magnitude is disposed between a first line port 724_1 and a second line port 724_2, at least one inductor and at least one capacitor is disposed between a coupling port 734_1 and a terminal port 741_1, and an adjusting capacitor 770 is additionally connected through a capacitor connecting port 714_1 disposed between the coupling port 734_1 and the terminal port 741_1.

Referring to FIGS. 7A to 7C, at least a portion of the coupler 700 may have a form, in which it is embedded in the printed circuit board (e.g., the printed circuit board 340 of FIG. 2). An aspect that the coupler 700 is embedded in the printed circuit board may include a concept that at least some of the components included in the coupler 700 constitute at least a portion of the printed circuit board PCB. Furthermore, an aspect that the coupler 700 is embedded in the printed circuit board, as another example, may include a concept that the printed circuit board has a function of the coupler 700. The printed circuit board, in which the coupler 700 is embedded, for example, may be a board including a first layer 710, a second layer 720, a third layer 730, and/or a fourth layer 740. FIGS. 7A to 7D are views illustrating only a part of the printed circuit board, in which the coupler 700 is included, and in which other parts are omitted. According to an embodiment, overall shapes or sizes of the layers 710, 720, 730, and 740 (or the conductive parts of the layers) included in the coupler 700 mounted on the printed circuit board are not limited to the shapes of the illustrated drawings, and at least some of the shapes and sizes of the conductive parts of the at least some of the layers may be different.

In some embodiments, the first layer 710 may include a first conductive part 711 formed of a conductive material or a conductive member, a first opening 713, which passes in the z axis direction on one side of the first conductive part 711 and at least a portion of which is filled with an insulating material, and a first conductive flat plate 712_3 disposed in the first opening 713 and electrically isolated from the first conductive part 711. The first conductive part 711 may include at least one via hole 712_1 and 712_2.

In some embodiments, the first conductive flat plate 712_3 may be disposed at at least a portion of an area of the first opening 713. The first conductive flat plate 712_3, for example, may include a first via hole 712_3a for electrical connection to the conductive flat plates 722_3 and 733_3 formed in another layer (e.g., the second layer 720 or the third layer 730), a first hole periphery part 712_3a that defines the first via hole 712_3b, a first extension part 712_3c that extends from the first hole periphery part 712_3a while having a specific width in one direction (e.g., the x axis direction), and a second extension part 712_3d that extends from the first extension part 712_3c while having a specific area in the y axis direction. The second extension part 712_3d has been distinguished from the first extension part 712_3c to distinguish the first extension part 412_3c in the description of the first conductive flat plate 412_3 in FIG. 4, but the disclosure is not limited thereto. For example, it may be described that the first conductive flat plate 712_3 has one extension part including the first extension part 712_3c and the second extension part 712_3d and the adjusting capacitor 770 is electrically connected to the one extension part.

In some embodiments, at least a portion of the first conductive flat plate 712_3 included in the first layer 710 may be coupled to a RF signal transmission line 724 of the second layer 720. When viewed in the z axis direction, at least a portion of the second extension part 712_3d may overlap the RF signal transmission line disposed in the second layer 720. In some embodiments, the first conductive flat plate 712_3 may include the capacitor connecting port 714_1 electrically connected to the adjusting capacitor 770 (e.g., a shut capacitor) separately provided for adjusting coupling. The capacitor connecting port 714_1, for example, may be at least one point of the second extension part 712_3d. The first conductive part 711 may include an area that is opened to an area that is adjacent to the capacitor connecting port 714_1. For example, the opened area may be included in the first opening 713.

In some embodiments, the second layer 720 may be the same as or similar to the second layer 420 described above in FIGS. 4A to 4D. For example, the second layer 720 (e.g., the second layer 420 of FIGS. 4A to 4D) may include a second conductive part 721 (e.g., the second conductive part 421) formed of a conductor, a second opening 723 (e.g., the second opening 423 of FIGS. 4A to 4D) formed inside the second conductive part 721 and filled with an insulating material, a first RF signal transmission line 724 (e.g., the first RF signal transmission line 424 of FIGS. 4A to 4D) disposed in the second opening 723, or a second conductive flat plate 722_3 (e.g., the second conductive flat plate 422_3 of FIGS. 4A to 4D) disposed in the second opening 723 and electrically isolated from the second conductive part 721 and the first RF signal transmission line 724. The second conductive part 721 may include at least one via hole 722_1 and 722_2 used for electrical connection to the first conductive part 711. The first RF signal transmission line 724 (e.g., the first RF signal transmission line 424 of FIGS. 4A to 4C) may include the first line port 724_1 disposed on one side of a periphery of the second opening 723 in the negative x axis direction, and the second line port 724_2 disposed on one side of a periphery thereof in the y axis direction. At least a portion of the second conductive part 721 in the y axis direction, for example, may be opened. At least a portion of the second conductive part 721 in the x axis direction, for example, may be opened. The first RF signal transmission line 724, for example, may transmit the signal of the first frequency band. In an embodiment, the first RF signal transmission line 724 may have a shape that is substantially the same as that of the first RF signal transmission line 424 of FIGS. 4A to 4C.

In some embodiments, the second conductive flat plate 722_3 may be electrically connected to the first conductive flat plate 712_3 disposed in the first layer 710 and a third conductive flat plate 732_3 disposed in the third layer 730. For example, the second conductive flat plate 722_3 may have a shape that is substantially the same as that of the second conductive flat plate 422_3 of FIG. 4A.

In some embodiments, the third layer 730 may have a configuration and a shape that are the same as or similar to those of the third layer 430 described above in FIGS. 4A to 4D. For example, the third layer 730 (e.g., the third layer 430 of FIGS. 4A to 4D) may include a third conductive part 731 (e.g., the third conductive part 431 of FIGS. 4A to 4D) formed of a conductive material or a conductor, a third opening 733 (or a fill-cut area) (e.g., the third opening 433 of FIGS. 4A to 4D), the third conductive flat plate 732_3 (e.g., the third conductive flat plate 432_3 of FIGS. 4A to 4D), or a first conductive pattern 734 (e.g., the first conductive pattern 434 FIGS. 4A to 4D). The third conductive part 731 may include at least one via hole 732_1 and 732_2 used for electrical connection to the second conductive part 721. In some embodiments, the third conductive part 731 may include at least one via hole 732_4 used for electrical connection to a fourth conductive part 741 of the fourth layer 740. The third opening 733 may include an opening area (e.g., an opening formed on one side of a periphery that faces the negative y axis direction of the third opening 733). The third conductive flat plate 732_3 may be electrically connected to the first conductive pattern 734. The first conductive pattern 734 may include at least one coiling portion. A first pattern via hole 732_4 used for electrical connection to a second pattern via hole 742_4 of the fourth layer 740 may be formed on one side of the coiling portion. The coupling port 734_1 may be formed at an end of one side of the first conductive pattern 734. The coupling port 734_1 may be disposed in an opening area of the third opening 733.

In some embodiments, the fourth layer 740 may have a configuration and a shape that are the same as or similar to those of the fourth layer 440 described above in FIGS. 4A to 4D. For example, the fourth layer 740 (e.g., the fourth layer 440 of FIGS. 4A to 4D) may be disposed (disposed on a lower side of the third layer 730) to be adjacent to the third layer 730, and may include the fourth conductive part 741 (e.g., the fourth conductive part 441 of FIGS. 4A to 4D), a fourth opening 743 (or a fill-cut area) (e.g., the fourth opening 443 of FIGS. 4A to 4D), or a second conductive pattern 744 (a conductive line) (e.g., the second conductive pattern 444 of FIGS. 4A to 4D). In some embodiments, the fourth conductive part 741 may include at least one via hole 742_5 used for electrical connection to the third conductive part 731 of the third layer 730, and may include at least one via hole 742_6 used for electrical connection to another layer (e.g., a ground layer) of the printed circuit board 340 or other configurations mounted on the printed circuit board 340. An opening area may be included on one side (e.g., a periphery in the negative y axis direction) of the fourth opening 743, and a terminal port 744_1 formed at an end of one side of the second conductive pattern 744 may be disposed in the opening area. The second pattern via hole 742_4 used for electrical connection to the first conductive pattern 734 disposed in the third layer 730 may be formed at an end of one side of the second conductive pattern 744 disposed in the fourth opening 743.

Referring to FIG. 7D, the coupler 700 may further include a fifth layer 750 and a sixth layer 760, in addition to the first layer 710, the second layer 720, the third layer 730, and the fourth layer 740, for connection to the adjusting capacitor 770.

In some embodiments, a partial structure of the first layer 710 may have a shape that is the same as that of the first layer described above in FIG. 7A. The first layer 710 may include a fourth conductive flat plate 712_4 connected to the first extension part 712_3c or the second extension part 712_3d of the first conductive flat plate 712_3, and an opening 714, in which the fourth conductive flat plate 712_4 is disposed. The fourth conductive flat plate 712_4 may include a fourth via hole 712_4b used for electrical connection to the via hole formed in the fifth layer 750, or a fourth hole periphery part 712_4a that defines the fourth via hole 712_4b. The fourth hole periphery part 712_4a may further include a wiring line for electrical connection to the first extension part 712_3c or the second extension part 712_3d, together with a ring shape that defines the fourth via hole 712_4b. The first conductive part 711 that defines the first layer 710 may further include the opening 714, in which the fourth conductive flat plate 712_4 may be disposed. The opening 714 may be connected to the first opening 713. The second to fourth layers 720, 730, and 740 may have structures that are substantially the same or similar to those of the second to fourth layer described above in FIGS. 7A to 7CC.

In some embodiments, the fifth layer 750 may include a fifth conductive part 751 formed of a conductor, a fifth opening 753, a fifth conductive flat plate 752_4, or a sixth conductive flat plate 752_5. The fifth conductive part 751 may be disposed on an upper side of the first conductive part 711, which faces the z axis direction. As another example, according to a change in the disposition sequence, the fifth conductive part 751 may be disposed on a lower side of the first conductive part 711, which faces the negative z axis direction. The fifth opening 753 may be formed in the first conductive part 711. At least a portion of the fifth opening 753 may include an insulating material or an insulating layer. When viewed in the z axis direction, at least a portion of the fifth opening 753 may be disposed to overlap the opening 714 formed in the first layer 710 while being spaced apart therefrom.

In some embodiments, the fifth conductive flat plate 752_4 may be electrically isolated from the fifth conductive part 751 through at least a portion of the fifth opening 753. The fifth conductive flat plate 752_4 may include a fifth via hole 752_4b used for electrical connection to the fourth via hole 712_4b, a fifth hole periphery part 752_4a that defines the fifth via hole 752_4b, a first capacitor via hole 752_5b electrically connected to a capacitor connecting pad 762_5 (e.g., electrically connected to the capacitor connecting port 714_1) formed in the sixth layer 760, a hole periphery part 752_5a that forms the first capacitor via hole 752_5b, or a connection wiring line 752_6 that connects the fifth hole periphery part 752_4a and the hole periphery part 752_5a.

In some embodiments, the sixth layer 760 may include a sixth conductive part 761, a sixth opening 763, the capacitor connecting pad 762_5, or a second capacitor via hole 762_5b. The sixth conductive part 761 may be disposed on an upper side of the fifth conductive part 751 in the z axis direction or on a lower side thereof in the negative z axis direction. An insulating layer may be disposed between the sixth conductive part 761 and the fifth conductive part 751. The sixth opening 763 may be formed in the sixth conductive part 761. The sixth opening 763 may include an area that is opened in the z axis or negative z axis direction. The capacitor connecting pad 762_5 may be disposed in the sixth opening 763. When viewed in the z axis direction, at least a portion of the sixth opening 763 may be disposed to overlap the fifth opening 753 formed in the fifth layer 750.

In some embodiments, the capacitor connecting pad 762_5 may be disposed in the sixth opening 763, and may be electrically isolated from the sixth conductive part 761 through the sixth opening 763. The adjusting capacitor 770 or a wiring line electrically connected to the adjusting capacitor 770 may be connected to the capacitor connecting pad 762_5. The adjusting capacitor 770 may be disposed in a specific layer of the printed circuit board 340, in which the coupler 700 is embedded. For example, the adjusting capacitor 770 may be disposed in a specific area of the sixth layer 760, in which the first to fourth layers 710, 720, 730, and 740 are disposed. The second capacitor via hole 762_5b may be formed in the capacitor connecting pad 762_5. The second capacitor via hole 762_5b may be disposed to pass in the z axis direction of the capacitor connecting pad 762_5. At least a portion of the second capacitor via hole 762_5b, for example, may be disposed to overlap the first capacitor via hole 752_5b in the z axis direction. The coupler 700 may further include a conductive member for electrically connecting the first capacitor via hole 752_5b and the second capacitor via hole 762_5b.

Although it has been described in the above description with reference to the structure, in which the couplers 400, 500, 600, and 700 include the first to fourth layers (e.g., 710, 720, 730, and 740 in the case of the coupler 700), various embodiments are not limited thereto. For example, the first layer may be excluded or the fourth layer may be excluded, and only two layers or three layers may be included in at least one of the above-described couplers 400, 500, 600, and 700. When the coupler is formed of two layers or three layers, the terminal port may be disposed in another area of the printed circuit board, in which the coupler is formed.

Although it has been described that the adjusting capacitor 770 is connected to the first conductive flat plate 712_3, the disclosure is not limited thereto. For example, the adjusting capacitor 770 may be connected to at least one of the second conductive flat plate 722_3 or the third conductive flat plate 732_3, which is electrically connected to the first conductive flat plate 712_3. As another example, a plurality of adjusting capacitors 770 may be included. For example, the plurality of adjusting capacitors 770 may be connected to the conductive flat plates 712_3, 722_3, and 732_3. According to various embodiments, at least one adjusting capacitor 770 may be disposed to be connected to at least one of the conductive patterns 734 and 744. Although the adjusting capacitor 770 may be disposed in a layer of the printed circuit board, which is the same as the layer, in which the conductive flat plate or the conductive pattern is disposed, various embodiments of the disclosure are not limited thereto. For example, the adjusting capacitor 770 may be disposed in a layer that is different from the layer, in which the conductive flat plate or the conductive pattern is disposed, which is electrically connected thereto. For example, the adjusting capacitor 770 may be disposed on an outermost layer (e.g., an uppermost layer or a lowermost layer exposed to an outside) of the printed circuit board 340, and may be electrically connected to the conductive flat plate through a via hole or a wiring line.

Figure 8A:
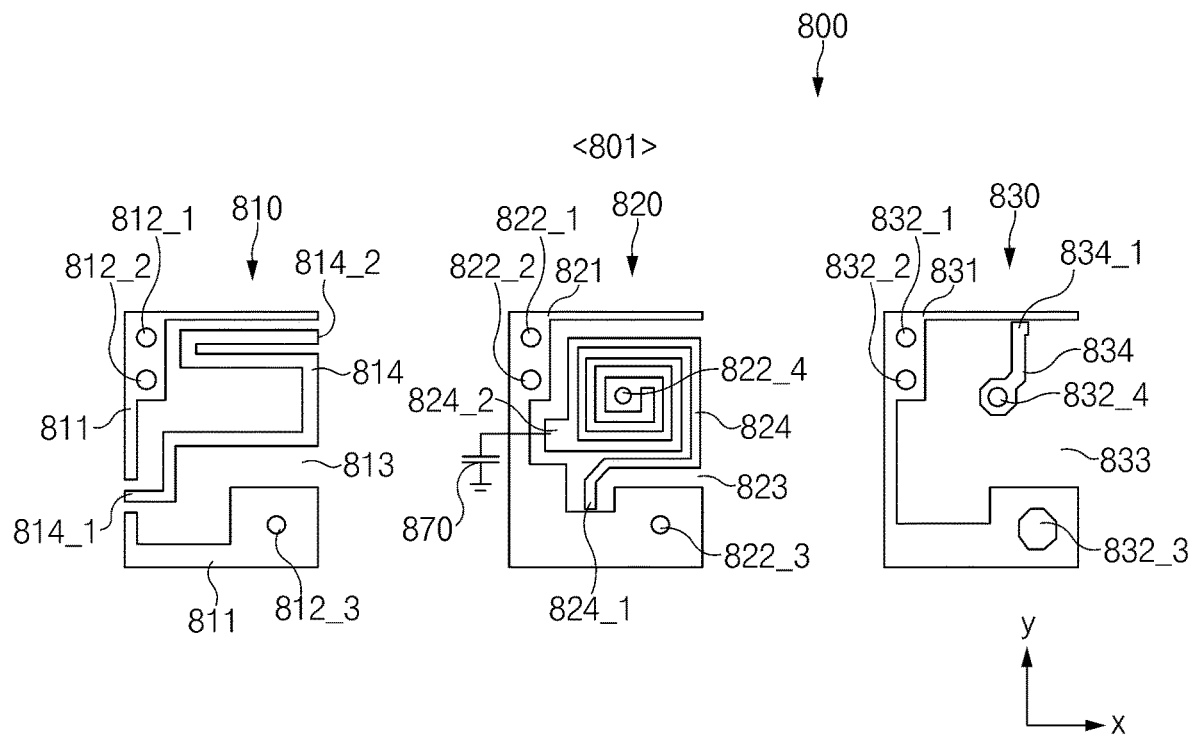
FIGS. 8A, 8B, and 8C are views illustrating structures of layers of a coupler 800 embedded in a printed circuit board according to an embodiment of the disclosure.
Figures 8B, 8C:
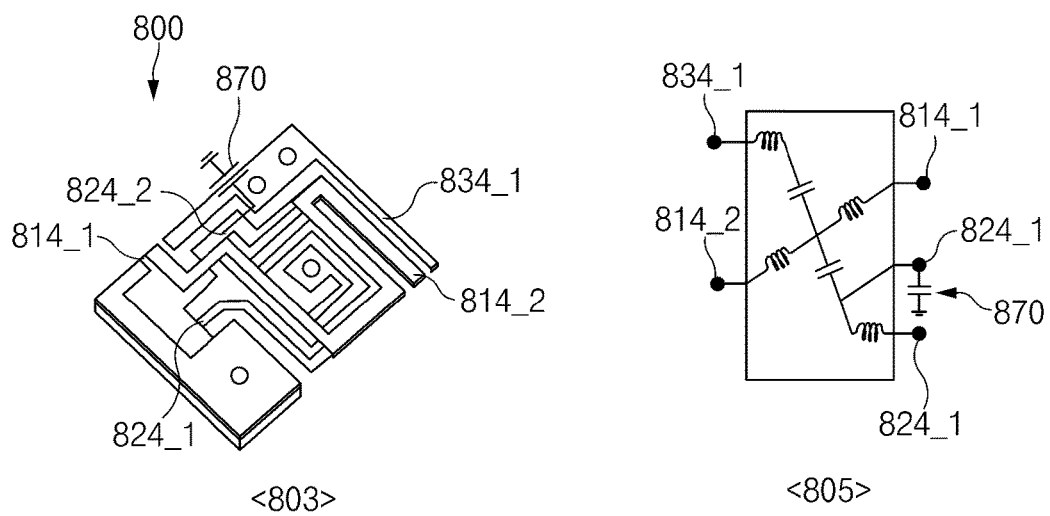
Figure 8D:
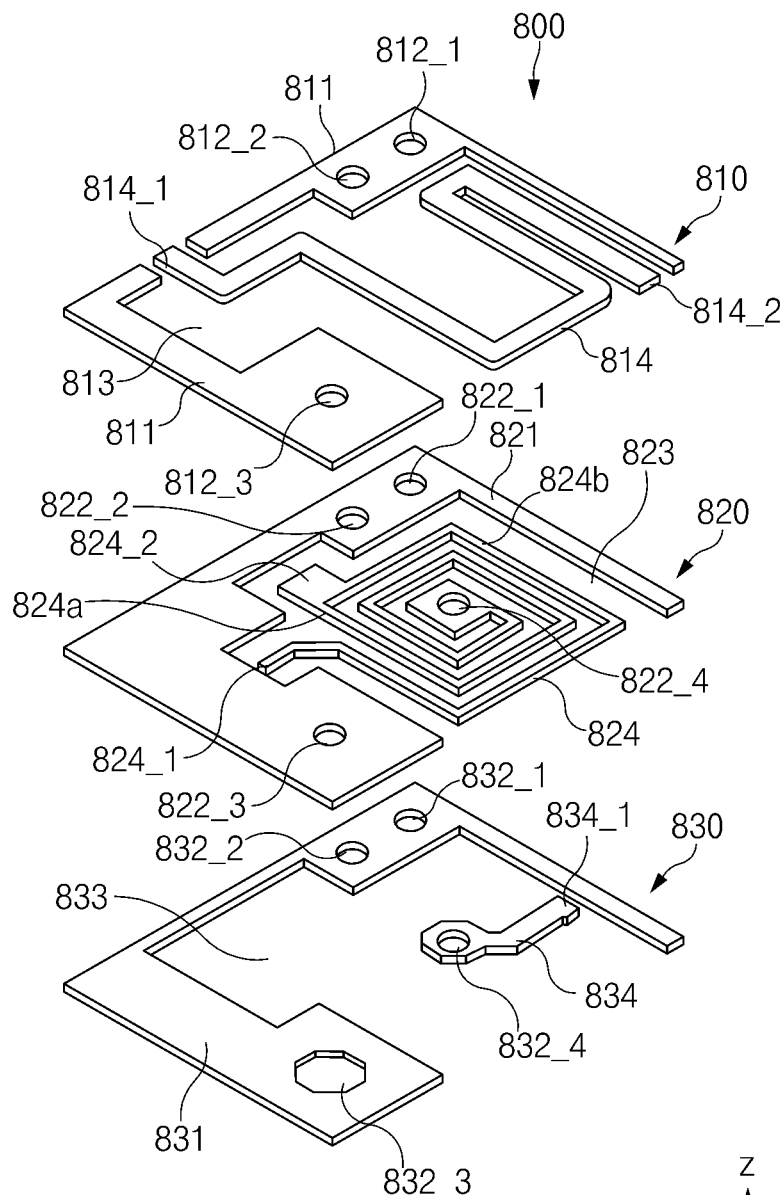
FIG. 8D illustrates an exploded perspective view of a coupler 800 embedded in a printed circuit board according to an embodiment of the disclosure.

FIGS. 8A to 8C are views illustrating structures of layers of a coupler 800 embedded in a printed circuit board according to an embodiment of the disclosure. FIG. 8A is a view illustrating front surfaces (e.g., a surface that faces the z axis direction) of the layers included in the structure of the coupler 800. FIG. 8B illustrates a perspective view of a state, in which the layers illustrated as seen in FIG. 8A are coupled to each other. FIG. 8C is a view illustrating an equivalent circuit of that which is seen in FIG. 8B. FIG. 8D illustrates an example of an exploded perspective view of the coupler 800 embedded in the printed circuit board according to an embodiment of the disclosure. Referring to FIG. 8C, the coupler 800 may have a structure, in which at least one inductor having an inductance of a first magnitude is disposed between a first line port 814_1 and a second line port 814_2, at least one inductor having a second inductance and at least one capacitor having a first capacitance are disposed between a coupling port 824_1 and a terminal port 834_1, and an adjusting capacitor 870 is connected through a capacitor connecting port 824_2 between the coupling port 824_1 and the terminal port 834_1.

Referring to FIGS. 8A to 8D, the printed circuit board, in which the coupler 800 is embedded, for example, may include a first layer 810, a second layer 820, and a third layer 830. In some embodiments, overall shapes or sizes of the layers 810, 820, and 830 (or the conductive parts of the layers) included in the coupler 800 mounted on the printed circuit board are not limited to the shapes of the illustrated drawings, and at least some of the shapes and sizes of the conductive parts of the at least some of the layers may be different. In some embodiments, although it is illustrated in the illustrated drawings that a first conductive part 811 is separated into two parts, the embodiments are not limited thereto, and the first conductive part 811 may have a form, in which at least a portion thereof is connected in an area of the printed circuit area, except for the illustrated area.

In some embodiments, the first layer 820 may be disposed on a lower side of the second layer 820 with respect to the first direction (e.g., a direction that faces the z axis of FIG. 8D). According to various embodiments, the first layer 810, for example, may include the first conductive part 811, a first opening 813, or a RF signal transmission line 814.

In some embodiments, the first conductive part 811 may be formed to surround at least a portion of the first opening 813. At least one conductive via hole 812_1, 812_2, and 812_3 used for electrical connection to another layer (e.g., the second layer 820) may be formed in the first conductive part 811. For example, the first conductive part 811 may include a portion disposed at a periphery in the y axis direction and a portion of a periphery disposed in the negative x axis direction, and a portion disposed at a portion of a periphery in the negative x axis direction and a periphery in the negative y axis direction, with respect to the first opening 813. At least a portion of the first opening 813 may extend in the x axis direction. In an embodiment, the via holes 812_1 and 812_2 may be disposed on one side of the first conductive part 811, and the via hole 812_3 may be disposed on an opposite side of the first conductive part 811.

In some embodiments, an insulator may be disposed at at least a portion of the first opening 813. The RF signal transmission line 814 may be disposed in the first opening 813. The RF signal transmission line 814, for example, may include the first line port 814_1 disposed in an opening area formed on one side of the first conductive part 811, the second line port 814_2 disposed at a periphery of the first opening 813 in the x axis direction, and a line including the first line port 814_1 and the second line port 814_2.

In some embodiments, the RF signal transmission line 814 may have a length, by which a signal (a signal of a sub6 frequency from a signal of a low frequency band) of a wide band or various frequency bands may be received. As another example, the length of the RF signal transmission line 814 may be determined based on a band of a frequency that is to be coupled. In an embodiment, at least a portion of the RF signal transmission line 814 may include a convexo-concave structure. An entire length of the RF signal transmission line 814, for example, may be a length that is the same as or similar to that of the RF signal transmission line 424 described above in FIGS. 4A to 4C.

In some embodiments, the second layer 820 may be disposed on the first layer 810 (e.g., disposed on a lower side or an upper side of the first layer 810) with respect to the first direction (e.g., a direction that faces the z axis). The second layer 820, for example, may include a second conductive part 821, a second opening 823 (or a fill-cut area), or the first conductive pattern 434, which are formed of a conductor.

In some embodiments, the second conductive part 821 may have a shape, at least a portion of which is similar to that of the first conductive part 811, and be formed to surround at least a portion of the second opening 823. At least one conductive via hole 821_1, 822_2, or 822_3 that is used for electrical connection to another layer (e.g., the first layer 810 or the third layer 830) may be formed in the second conductive part 821. The second opening 823 may extend in the x axis direction. The second opening 823 may be formed in the second conductive part 821. An insulating material or an insulating layer may be disposed at least a portion of the second opening 823. The first conductive pattern 824 may be disposed in the second opening 823. The first conductive pattern 824 may be electrically isolated from the second conductive part 821 through at least a portion of the second opening 823.

In some embodiments, the first conductive pattern 824 may be electrically connected to a second conductive pattern 834 disposed in the third layer 830. In some embodiments, the first conductive pattern 824 may include a first pattern via hole 822_4 used for a coiling portion or the second conductive pattern 834 formed at an end of one side of the coiling portion and disposed in the third layer 830. At least a portion of the first conductive pattern 824 may function as an inductor. At least a portion of the first conductive pattern 824 may be coupled to the RF signal transmission line 814 of the first layer 810.

In some embodiments, one side of the first conductive pattern 824 may be used as the capacitor connecting port 824_2. In some embodiments, the capacitor connecting port 824_2 may be located at the coiling portion. For example, the capacitor connecting port 824_2 may be located at a portion of the coiling portion, which is formed in a flat plate shape. The adjusting capacitor 870 may be electrically connected to the capacitor connecting port 824_2.

In some embodiments, the adjusting capacitor 870 may be disposed in a specific area of the printed circuit board 340, in which the coupler 800 is embedded. At least one adjusting capacitor 870, for example, may be disposed in at least one of the first to third layers 830, in which the coupler 800 is disposed. As another example, the adjusting capacitor 870 may be disposed in another layer of the printed circuit board 340, which is different from the layer, in which the coupler 800 is disposed. An end of one side of the coiling portion may be used as the coupling port 824_1.

In some embodiments, the third layer 830 may be disposed (e.g., disposed on a lower side or an upper side of the second layer 820) to be adjacent to the second layer 820 with respect to the first direction (e.g., a direction that faces the z axis direction), and may include a third conductive part 831, a third opening 833 (or a fill-cut area), or the second conductive pattern 834 (or a conductive line).

In some embodiments, the third conductive part 831 may include at least one via hole 832_1, 832_2, and 832_3 used for electrical connection to the second conductive part 821 of the second layer 820. The third conductive part 831 may be disposed to surround at least a portion of the third opening 833. An insulating material or an insulating member may be disposed at least a portion of the third opening 833. The second conductive pattern 834 may be disposed in the third opening 833. The second conductive pattern 834 may be electrically isolated from the third conductive part 831 through at least a portion of the third opening 833. A second pattern via hole 832_4 used for electrical connection to the first pattern via hole 822_4 formed in the second layer 820 may be formed on one side of the second conductive pattern 834, and a conductive line, a starting point of which is the second pattern via hole 832_4, and which extends to a periphery (e.g., a periphery in the y axis direction) of one side of the third opening 833 may be included. An end of a periphery of the second conductive pattern 834 in the y axis direction, for example, may be used as the terminal port 834_1. Another coupler or a terminal resistor (e.g., 50 Ohm) may be connected to the terminal port 834_1.

The coupler 800 may be designed such that an inductance is formed between the first line port 814_1 and the second line port 814_2 corresponding to opposite ends of the RF signal transmission line 814, an inductance and a capacitance are formed between the coupling port 824_1 and the terminal port 834_1, and the adjusting capacitor 870 is connected to one side of the first conductive pattern 824 whereby a signal of various bands is coupled according to a capacitance of the adjusting capacitor 870. The coupler 800 of FIGS. 8A through 8D may include three layers to be manufactured to be smaller, and may be formed to be slimmer than other couplers having different thicknesses. As another example, the coupler 800 may secure excellent isolation characteristics by using laser vias 812_1, 812_2, and 812_3, may reduce signal damping by implementing the RF signal transmission line 814 with one micro-strip, and may provide an excellent connectivity without any discontinuity through an inner via during connection to other parts.

Figure 9A:
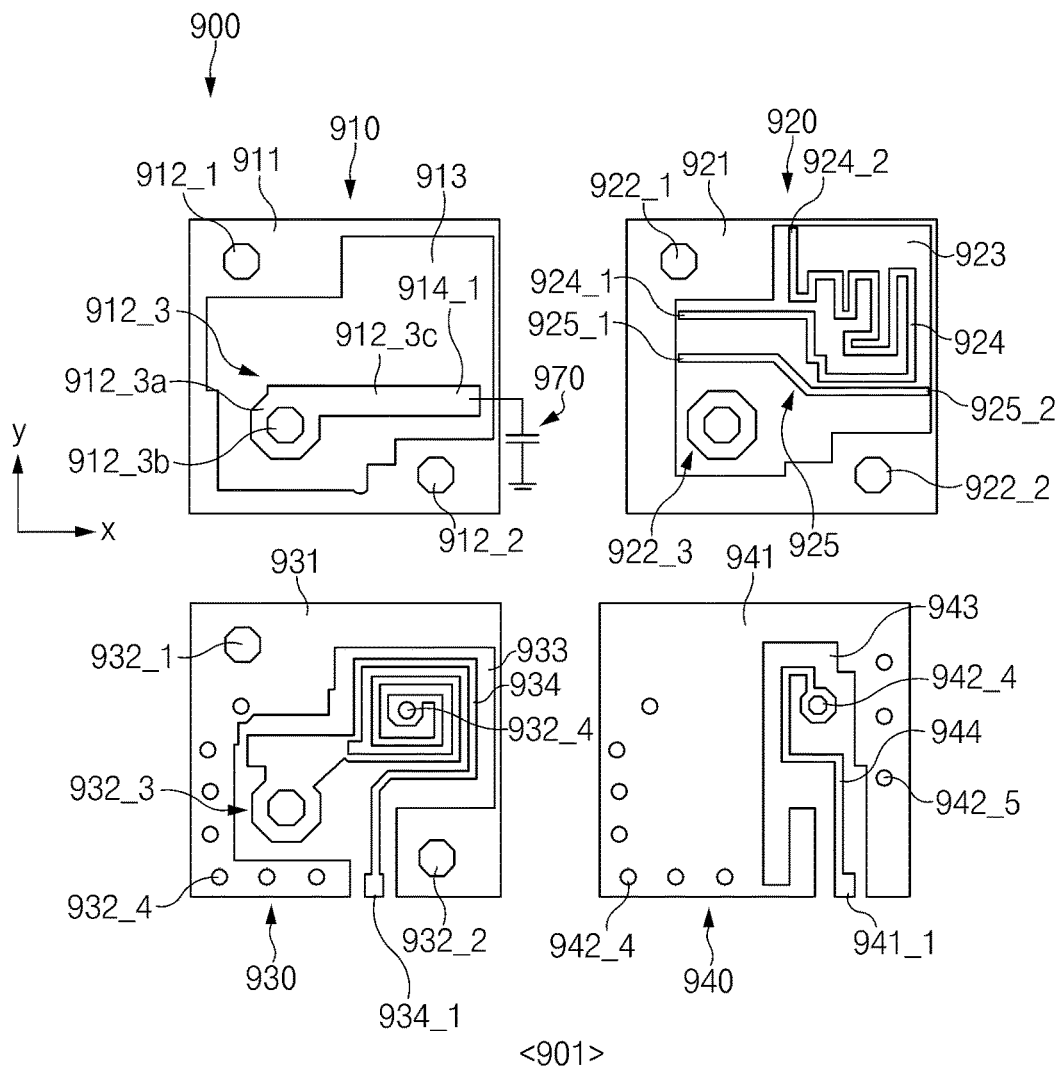
FIGS. 9A and 9B are views illustrating structures of layers and an equivalent circuit of a coupler 900 embedded in a printed circuit board according to an embodiment of the disclosure.
Figure 9B:
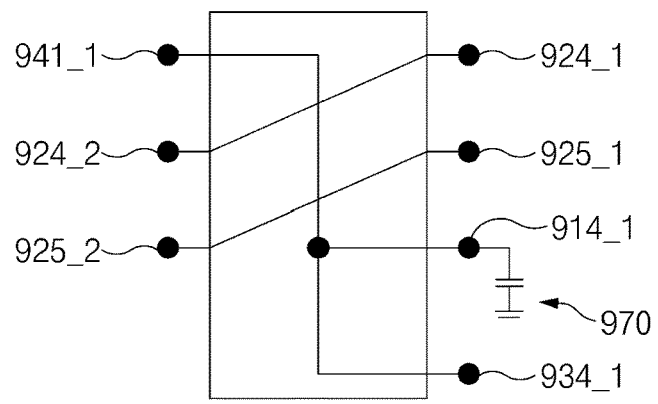

FIGS. 9A and 9B are views illustrating structures of layers and an equivalent circuit of a coupler 900 embedded in a printed circuit board according to an embodiment of the disclosure. FIG. 9A is a view illustrating a front surface (e.g., a surface that faces the z axis direction) of the layers included in the coupler 900. FIG. 9B is a view illustrating an equivalent circuit to the coupler 900 designed as seen in FIG. 9A. Referring to FIG. 9A, the coupler 900 may include a first path between a first line port 924_1 and a second line port 924_2, a second path between a third line port 925_1 and a fourth line port 925_2, a third path between a coupling port 934_1 and a terminal port 941_1, or an adjusting capacitor 970 connected in parallel to the third path through a capacitor connecting port 914_1.

Referring to FIGS. 9A and 9B, at least a portion of the coupler 900 may have a form, in which it is embedded in the printed circuit board (e.g., the printed circuit board 340 of FIG. 2). The printed circuit board, in which the coupler 900 is embedded, for example, may be a board including a first layer 910, a second layer 920, a third layer 930, and/or a fourth layer 940. In some embodiments, overall shapes or sizes of the layers 910, 920, 930, and 940 (or the conductive parts of the layers) included in the coupler 900 mounted on the printed circuit board are not limited to the shapes of the illustrated drawings, and at least some of the shapes and sizes of the conductive parts of the at least some of the layers may be different.

For example, the first layer 910, similarly to the first layer 910 described above in FIGS. 6A to 6C, may include a first conductive part 911 (e.g., the first conductive part 611 of FIGS. 6A to 6D) formed of a conductive material or a conductive member, a first opening 913 (e.g., the first opening 613 of FIGS. 6A-6D), which passes in the z axis direction on one side of the first conductive part 911 and at least a portion of which may be filled with an insulating material, and a first conductive flat plate 912_3 (e.g., the first conductive flat plate 612_3 of FIGS. 6A to 6D) disposed in the first opening 913 and electrically isolated from the first conductive part 911. As another example, the coupler 900 may further include the capacitor connecting port 914_1 electrically connected to one side (one side of a first extension part 912_3c) of the first conductive flat plate 912_3 provided in the first layer 910 and the adjusting capacitor 970 electrically connected to the capacitor connecting port 914_1. As another example, the first conductive part 911 may include at least one via hole 912_1 and 912_2 used for electrical connection to a second conductive part 921 of the second layer 920 and a third conductive part 931 of the third layer 930. The first conductive flat plate 912_3, for example, may be disposed in an area of the first opening 913 inside the first conductive part 911. The first conductive flat plate 912_3, for example, may include a first via hole 912_3b for electrical connection to the conductive flat plates 922_3 and 932_3 formed in another layer (e.g., the second layer 920 or the third layer 930), a first hole periphery part 912_3a that defines the first via hole 912_3b, and a first extension part 912_3c that extends from the first hole periphery part 912_3a while having a specific width in one direction (e.g., the x axis direction). The capacitor connecting port 914_1 may be formed to include at least a portion of the first extension part 912_3c or may be formed of a conductive member electrically connected to the first extension part 912_3c. The adjusting capacitor 970 may be disposed on the same layer as the first layer 910 or may be disposed in another layer of the printed circuit board 340.

In some embodiments, the second layer 920 may have a structure that is the same as or similar to that of the second layer 920 described above in FIGS. 6A. For example, the second layer 920 (e.g., the second layer 620 of FIG. 6) may include the second conductive part 921 (e.g., the second conductive part 621 of FIGS. 6A to 6D), a second opening 923 (e.g., the second opening 623 of FIGS. 6A to 6D), which is formed inside the second conductive part 921 and at least a portion of which may be filled with an insulating material, a first RF signal transmission line 924 (e.g., the first RF signal transmission line 624 of FIGS. 6A to 6D) and a second RF signal transmission line 925 (e.g., the second RF signal transmission line 625 of FIGS. 6A to 6D) disposed in the second opening 923, or a second conductive flat plate 922_3 (e.g., the second conductive flat plate 622_3 of FIGS. 6A to 6D) disposed in the second opening 923 and electrically isolated from the second conductive part 921 and the first RF signal transmission line 924. At least one via hole 922_1 and 922_2 may be formed in the second conductive part 921. The first RF signal transmission line 924 may be formed of a line that connects the first line port 924_1 and the second line port 924_2 in a way that is the same as or similar to the first RF signal transmission line 624 of FIG. 6A. The second RF signal transmission line 925 may be formed of a line that connects the third line port 925_1 and the fourth line port 925_2 in a way that is the same as or similar to the second RF signal transmission line 625 of FIGS. 6A to 6C.

In some embodiments, the third layer 930 may have a structure that is the same as or similar to that of the third layer 630 described above in FIGS. 6A to 6C. For example, the third layer 930 (e.g., the third layer 630 of FIGS. 6A to 6D) may include the third conductive part 931 (e.g., the third conductive part 631 of FIGS. 6A to 6D) formed of a conductive material or a conductor, a third opening 933 (or a fill-cut area) (e.g., the third opening 633 of FIGS. 6A to 6D), a third conductive flat plate 932_3 (e.g., the third conductive flat plate 632_3 of FIGS. 6A to 6D), or a first conductive pattern 934 (e.g., the first conductive pattern 634 of FIGS. 6A to 6D). The third conductive part 931 may include at least one via hole 932_1 and 932_2 used for electrical connection to the second conductive part 921. In some embodiments, the third conductive part 931 may include at least one via hole 932_5 used for electrical connection to the fourth conductive part 641 of the fourth layer 940. The third conductive flat plate 932_3 may be electrically connected to the first conductive pattern 934, and the first conductive pattern 934 may include at least one coiling portion. A first pattern via hole 932_4 used for electrical connection to a second pattern via hole 942_4 of the fourth layer 940 may be formed on one side of the coiling portion. An end of one side of the first conductive pattern 934 may be used as the coupling port 934_1 or a structure for the coupling port 934_1 may be disposed at the end. The coupling port 934_1 may be disposed in an opening area (e.g., the first opening area 431a of FIGS. 4A to 4C) on one side of the third conductive part 931.

In some embodiments, the fourth layer 940 may have a structure that is the same as or similar to that of the fourth layer 640 described above in FIGS. 6A to 6C. For example, the fourth layer 940 (e.g., the fourth layer 640 of FIGS. 6A to 6D) may be disposed (disposed on a lower side of the third layer 930) to be adjacent to the third layer 930, and may include a fourth conductive part 941 (e.g., the fourth conductive part 641 of FIGS. 6A to 6D), a fourth opening 943 (or a fill-cut area) (e.g., the fourth opening 643 of FIGS. 6A to 6D), or a second conductive pattern 944 (or a conductive line) (e.g., the second conductive pattern 644 of FIGS. 6A to 6D). In some embodiments, the fourth conductive part 641 may include at least one via hole 942_5 used for electrical connection to the third conductive part 731 of the third layer 930, and may include at least one via hole 942_4 used for electrical connection to another layer (e.g., a ground layer) of the printed circuit board 340 or other configurations mounted on the printed circuit board 340. The second pattern via hole 942_4 electrically connected to the first pattern via hole 932_4 may be formed on one side of the second conductive pattern 944, and the terminal port 941_1 may be disposed on an opposite side thereof. In some embodiments, the adjusting capacitor 970 may be connected to the second conductive pattern 934.

Figure 10B:
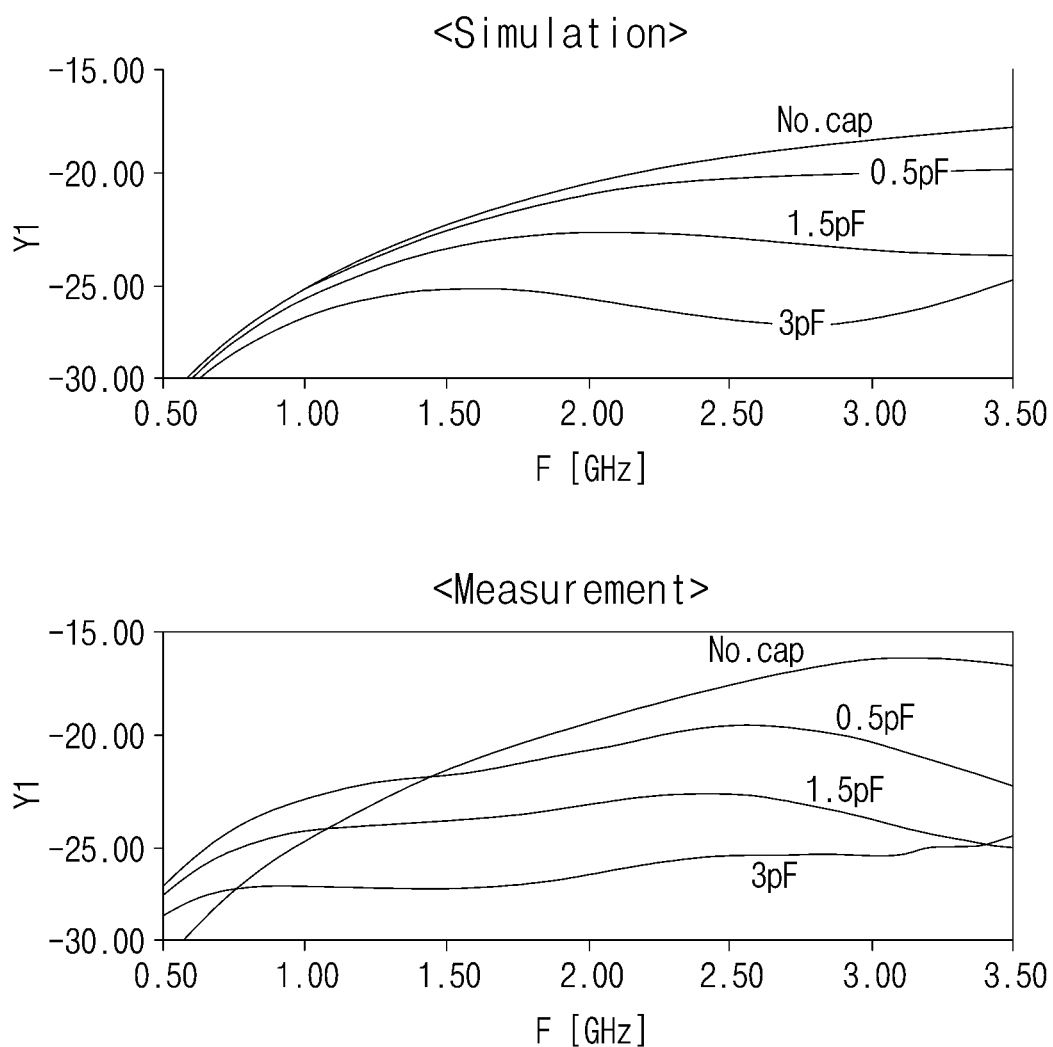
FIG. 10B is a view illustrating coupling characteristics according to change values of capacitances of an adjusting capacitor of FIG. 10A.

FIG. 10A is a view illustrating a change in capacitances of the capacitor of the coupler 700 including the adjusting capacitor (e.g., the adjusting capacitor 770 of FIGS. 7A to 7C) according to various embodiments (e.g., the embodiment of FIGS. 7A to 7D). FIG. 10B is a view illustrating coupling characteristics according to change values of capacitances of the adjusting capacitor of FIG. 10A. Additionally, FIGS. 10A and 10B illustrate measurement values for frequency bands according to changes in the capacitances of the adjusting capacitor in a PCB, on which the coupler including the adjusting capacitor is mounted. For example, FIGS. 10A and 10B illustrate a result obtained by measuring coupling characteristics of about 0.7 G to about 3.5 G while changing the capacitance of the adjusting capacitor (shunt capacitor) with simulations and actual network analyzers.

Referring to FIGS. 10A and 10B, as illustrated, it may be seen that the characteristic values in the coupler, to which the adjusting capacitor is applied, show characteristics that have been enhanced as compared with the characteristics of the coupler, to which the adjusting capacitor is not applied, when the measurement values for frequency bands for a structure, to which the adjusting capacitor is applied, and a structure, to which it is not applied. A coupler may be determined to be of a level that is similar to that of an external coupler product and may be used when a difference between coupling factors of the bands is within about 6 dB, and it may be identified that the coupling factor may satisfy a value within about 6 dB in a section of about 0.7 G to about 3.5 G when a capacitance between about 1.5 pF to about 3 pF is disposed. It may be identified that the coupler has a difficulty in being used for a wide band structure as about 10 dB or more is generated at a band of about 0.7 GHz to about 3.5 GHz when a difference between the coupling factors of the structure, to which the adjusting capacitor is not applied, is identified.

Figure 11:
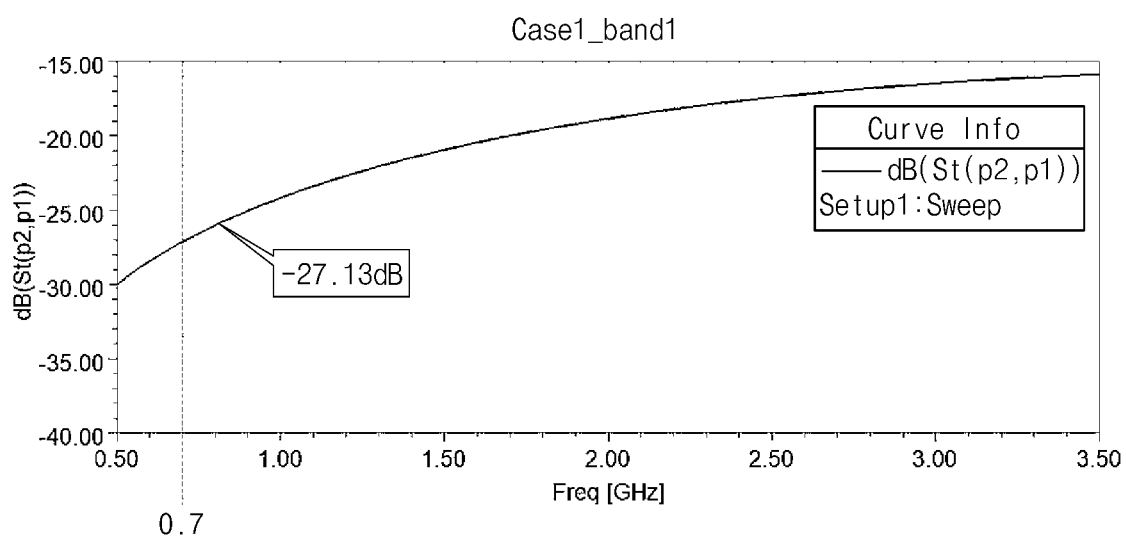
FIG. 11 is a view illustrating coupling characteristics at a low frequency band of a coupler (e.g., a coupler 400 of FIG. 4A) according to an embodiment.
Figure 12:
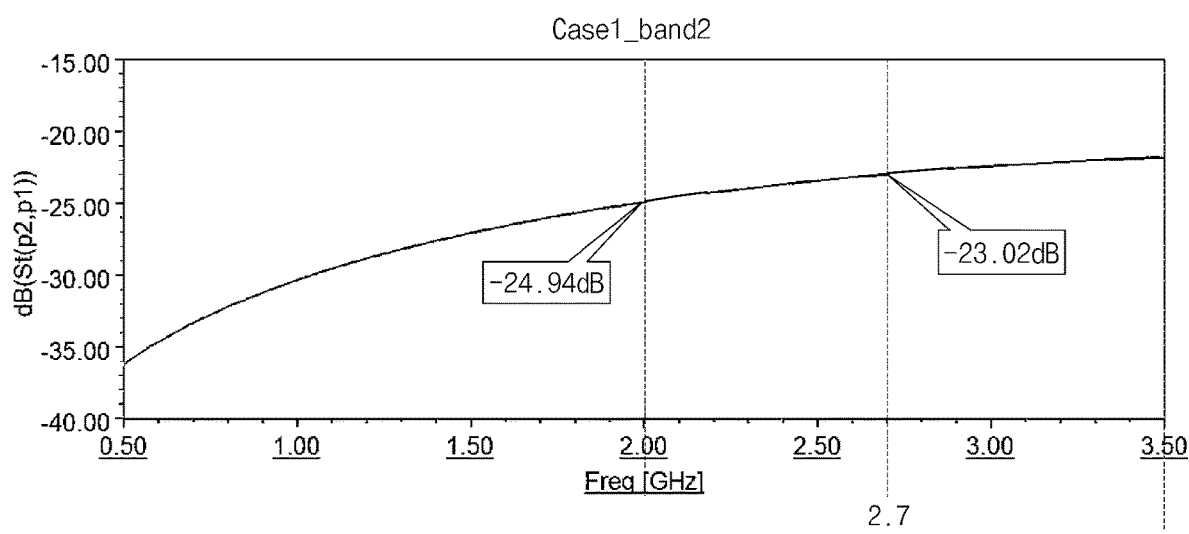
FIG. 12 is a view illustrating coupling characteristics at a middle, high, or sub6 frequency band of a coupler (e.g., a coupler 500 of FIG. 5A) according to an embodiment.
Figure 13:
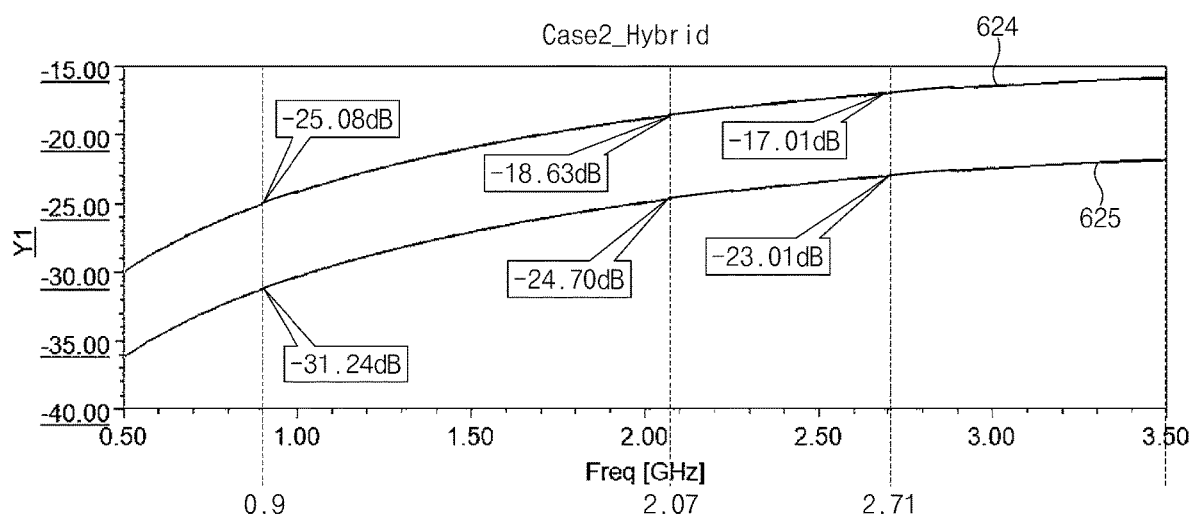
FIG. 13 is a view illustrating coupling characteristics at a low frequency band of a coupler (e.g., a coupler 600 of FIG. 6A) according to an embodiment.

FIG. 11 is a view illustrating coupling characteristics at a low frequency band of the coupler (e.g., the coupler 400 of FIGS. 4A to 4C) according to an embodiment. FIG. 12 is a view illustrating coupling characteristics at a middle, high, or sub6 frequency band of the coupler (e.g., the coupler 500 of FIGS. 5A to 5C) according to an embodiment. FIG. 13 is a view illustrating coupling characteristics at a low frequency band of the coupler (e.g., the coupler 600 of FIGS. 6A to 6C) according to an embodiment.

Referring to FIG. 11, the coupler 400 of FIGS. 4A to 4C shows the coupling characteristics of −27.13 dB for the first RF signal transmission line 424 with reference to 0.7 GHz. In this way, the coupler 400 of FIGS. 4A to 4C, which uses the first RF signal transmission line 424, may show characteristics of ±6 dB with reference to −25 dB at 1 GHz or less and may be used for management of coupling of a low band (e.g., 700 MHz).

Referring to FIG. 12, the coupler 500 of FIGS. 5A to 5C shows coupling characteristics of −24.94 dB for the second RF signal transmission line 524 with reference to 2 GHz, and shows the coupling characteristics of −23.02 dB with reference to 2.7 GHz. In this way, the coupler 500 of FIGS. 5A to 5C, which uses the second RF signal transmission line 524, may show characteristics of about −23 dB to −25 dB at 2 GHz to 2.7 GHz and may be used for management of coupling of a middle or high band (e.g., 2 to 2.7 GHz) that is a corresponding frequency band. When allowance of characteristics within ±6 dB with reference to −25 dB is referenced, the second RF signal transmission line 524 may be used for management of coupling of a frequency of about 1 GHz to 3.5 GHz.

Referring to FIG. 13, the coupler 600 of FIGS. 6A to 6C shows coupling characteristics of −31.24 dB for the first RF signal transmission line 624 with reference to 0.9 GHz, and shows coupling characteristics of −25.08 dB for the second RF signal transmission line 625. The coupler 600 of FIG. 6A shows coupling characteristics of −18.63 dB for the first RF signal transmission line 624 with reference to 2.07 GHz, and shows coupling characteristics of −24.70 dB for the second RF signal transmission line 625. The coupler 600 of FIG. 6A shows coupling characteristics of −17.01 dB for the first RF signal transmission line 624 with reference to 2.71 GHz, and shows coupling characteristics of −23.01 dB for the second RF signal transmission line 625. The coupler 600 showing the above-described characteristics may secure excellent coupling characteristics by using the first RF signal transmission line 624 (e.g., in the case of a low band management antenna) or using the second RF signal transmission line 625 (e.g., in the case of a middle band or high band management antenna).

As described above, a coupler (e.g., the coupler 700 of FIGS. 7A-7C) according to an embodiment may include a first layer 710 (or a first board), in which a first conductive flat plate 712_3 related to a coupling operation (or that supports a coupling operation or used for a coupling operation) is disposed, a second layer 720 (or a second board), which includes a first line port, to which a signal output from a wireless communication circuit is input and a second line port connected to an antenna and in which a signal transmission line 724 coupled to the first conductive flat plate 712_3 is disposed, a third layer 730 (or a third board) electrically connected to the first conductive flat plate and in which a first conductive pattern 734 coupled to the signal transmission line is disposed, and a capacitor 770 electrically connected to the first conductive flat plate. According to various embodiments, overall sizes of peripheries of the first board, second board, and the fourth board may be the same or similar and they may be arranged in a vertical direction, and the capacitor 770 may be disposed on an outer side of the peripheries of the boards while one side of the capacitor 770 is electrically connected to at least one of the boards. At least one of the flat plate or the line may be disposed inside the peripheries of the boards.

In some embodiments, the first layer may include a first conductive part formed of a conductor, and a first opening (in various embodiments, at least a portion of the first opening is filled with an insulating member) formed at at least a portion of an inside of the first conductive part, and the first conductive flat plate may be disposed to be electrically isolated from the first conductive part through the first opening.

In some embodiments, the first conductive flat plate may include a first via hole used for electrical connection, a first hole periphery part defining the first via hole, and an extension part extending from the first hole periphery part and overlapping at least a portion of the signal transmission line while having a specific interval when viewed in one direction, and the capacitor may be electrically connected to one side of the extension part.

In some embodiments, the second layer may include a second conductive part formed of a conductor and electrically connected to the first conductive part, a second opening (as various embodiments, at least a portion of the second opening is filled or blocked with an insulating member or an insulating member layer that covers the second opening is present) formed at at least a portion of an inside of the second conductive part, and a second conductive flat plate disposed in the second opening and in which a second via hole electrically connected to the first via hole.

In some embodiments, the third layer may include a third conductive part formed of a conductor and electrically connected to the second conductive part, a third opening (as various embodiments, at least a portion of the third opening is filled with an insulating member) formed at at least a portion of an inside of the third conductive part, and a third conductive flat plate disposed in the third opening, electrically connected to the first conductive pattern, and in which a third via hole electrically connected to the second via hole is formed.

In some embodiments, an area of the first conductive flat plate may be larger than an area of the third conductive flat plate.

In some embodiments, the coupler may further include a fourth layer disposed to be adjacent to the third layer, and the fourth layer may include a fourth conductive part electrically connected to the third conductive part of the third layer and formed of a conductor, a fourth opening (as various embodiments, at least a portion of the fourth opening is filled with an insulating member) formed at at least a portion of an inside of the fourth conductive part, and a second pattern located in the fourth opening and electrically connected to the first conductive flat plate.

In some embodiments, the first conductive pattern may include a first pattern via hole formed on one side thereof, and the second conductive pattern may include a second pattern via hole electrically connected to the first pattern via hole, and a terminal port, to which a terminal resistor is connected.

In some embodiments, the first conductive pattern may be a line having at least one inflection point, a line, at least a portion of which includes a curve, or a line, at least a portion of which has a corner due to bending).

In some embodiments, the first conductive pattern may include a first coiling portion coiled in a first direction, and a second coiling portion coiled in a second direction.

In some embodiments, one end or the first coiling portion may include a coupling port used to transmit a coupling signal to the wireless communication circuit.

In some embodiments, the first layer may include a fourth conductive flat plate electrically connected to the first conductive flat plate and in which a fourth via hole is formed.

In some embodiments, the coupler may further include a fifth layer (or a fifth board) disposed to be adjacent to the first layer, and the fifth layer may include a fifth via hole electrically connected to the fourth via hole and a fifth hole periphery part defining the fifth via hole, and a first capacitor via hole electrically connected to the fifth hole periphery part.

In some embodiments, the coupler may further include a sixth layer (or a sixth board) disposed to be adjacent to the fifth layer, the sixth layer may include a second capacitor via hole electrically connected to the first capacitor via hole, and a capacitor connecting pad defining the second capacitor via hole, and the capacitor may be electrically connected to the first conductive flat plate through the second capacitor via hole of the capacitor connecting pad.

In some embodiments, the capacitor may include at least one of a tunable capacitor or a shunt capacitor.

In some embodiments, the signal transmission line may include at least one of a first signal transmission line that transmits a signal of a first frequency band, and a second signal transmission line that transmits a signal of a second frequency band that is different from the first frequency band.

As described above, a printed circuit board having a plurality of layers may include a coupler formed at at least a portion of the printed circuit board, and the coupler may include a first layer 710, in which a first conductive flat plate 712_3 related to a coupling operation is disposed, a second layer 720, in which a signal transmission line 724 including a line port, to which a signal output from a wireless communication circuit is input, and a line port connected to an antenna is disposed, a third layer 730 electrically connected to the first conductive flat plate and in which a first conductive pattern 734 coupled to the signal transmission line is disposed, and a capacitor 770 electrically connected to the first conductive flat plate.

As described above, an electronic device, in which a printed circuit board is disposed, may include an printed circuit board, in which a coupler having multiple layers is embedded, and the coupler may include a first layer 710, in which a first conductive flat plate 712_3 related to a coupling operation is disposed, a second layer 720, in which a signal transmission line 724 including a line port, to which a signal output from a wireless communication circuit is input, and a line port connected to an antenna is disposed, a third layer 730 electrically connected to the first conductive flat plate and in which a first conductive pattern 734 coupled to the signal transmission line is disposed, and a capacitor electrically connected to the first conductive flat plate.

As described above, a coupler may include a first layer 810, in which a first conductive part formed of a conductor and having at least one via hole for electrical connection to another layer, a first opening formed of an insulating member inside the first conductive part, and a signal transmission line 814 electrically isolated from the first conductive part through the first opening and including a line port 814_1, to which a signal output from a wireless communication circuit is output, and a line port 814_2 connected to an antenna are disposed, a second layer 820, in which a second conductive part having at least one via hole electrically connected to the first conductive part, a second opening formed of an insulating member inside the second conductive part, and a first conductive pattern 824 electrically isolated from the second conductive part through the second opening and including at least one winding in relation to a coupling operation for the signal transmission line are disposed, a third layer 830, in which a third conductive part having at least one via hole used for electrical connection to the second conductive part, a third opening formed of an insulating member inside the third conductive part, and a second conductive pattern electrically isolated from the third conductive part through the third opening and including one side electrically connected to the first conductive pattern through a via hole and an opposite side having a terminal port, to which a terminal resistor is connected are disposed, and a capacitor 870 electrically connected to the first conductive pattern.

As described above, a coupler may include a first layer 610, in which a first conductive part formed of a conductor and having at least one via hole for electrical connection to another layer, a first opening formed of an insulating member inside the first conductive part, and a first conductive flat plate 612_3 electrically isolated from the first conductive part through the first opening are disposed, a second layer 620, in which a second conductive part having at least one via hole electrically connected to the first conductive part, a second opening formed of an insulating member inside the second conductive part, a first signal transmission line 624 including a line port, to which a signal of a first frequency band output from a wireless communication circuit is input, and a line port connected to an antenna, a second signal transmission line 625 including a line port, to which a signal of a second frequency band output from the wireless communication circuit is input, and a line port connected to the antenna, and a second conductive flat plate 622_3 having a via hole electrically connected to the first conductive flat plate are disposed, a third layer 630, in which a third conductive part having at least one via hole used for electrical connection to the second conductive part, a third opening formed of an insulating member inside the third conductive part, a third conductive flat plate 632_3 electrically isolated from the third conductive part through the third opening and electrically connected to the second conductive flat plate, and a third layer 630 electrically connected to the third conductive flat plate and coupled to the first signal transmission line or the second signal transmission line, and a fourth layer 640, in which a second conductive pattern including one side electrically connected to the first conductive pattern through a via hole and an opposite side, on which a terminal port, to which a terminal resistor is connected, is formed.

Figure 14:
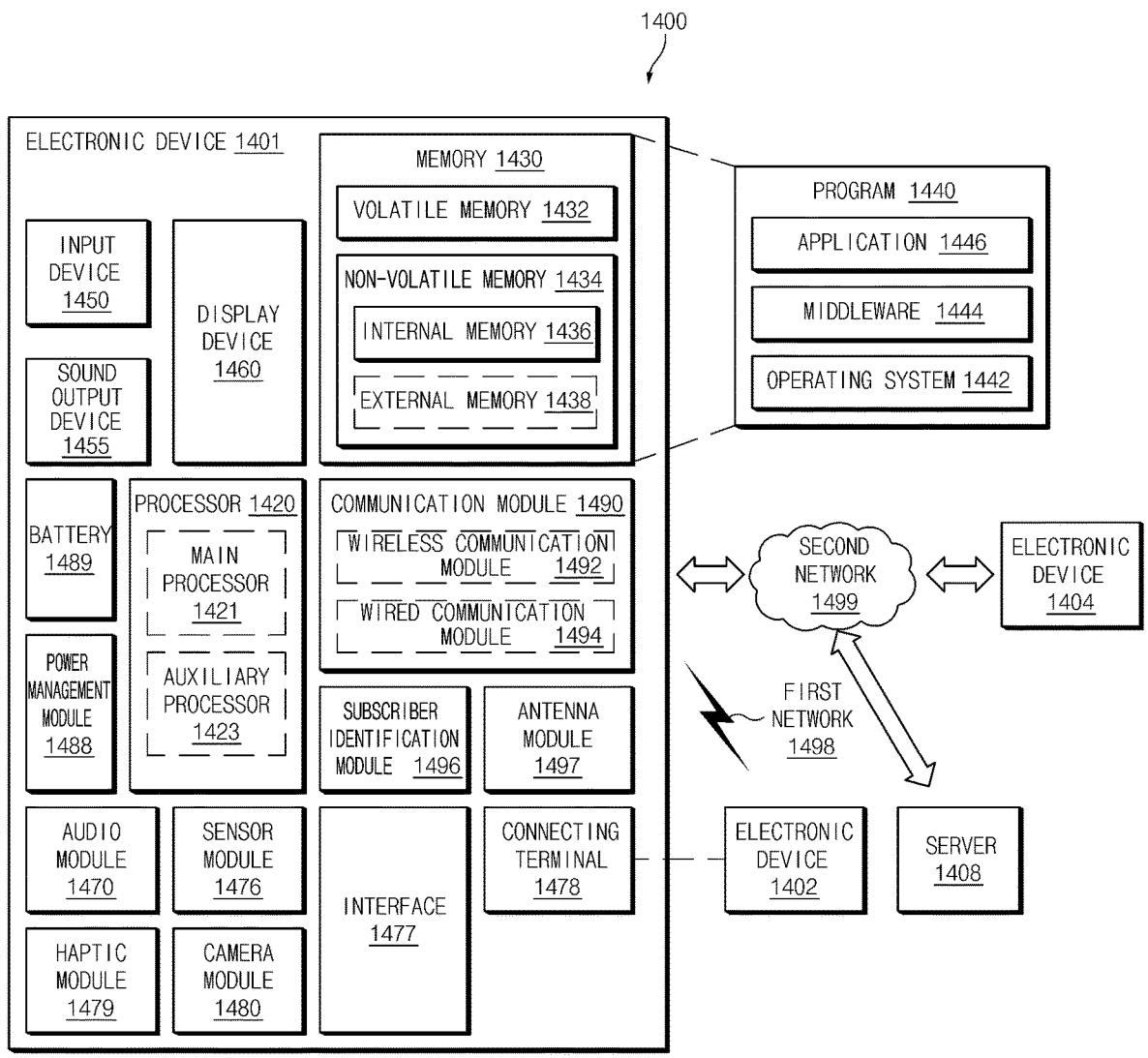
FIG. 14 is a block diagram of an electronic device 1401 in a network environment 1400 according to various embodiments.

FIG. 14 is a block diagram of an electronic device 1401 in a network environment 1400 according to various embodiments.

Referring to FIG. 14, in a network environment 1400, an electronic device 1401 may communicate an electronic device 1402 through a first network 1498 (e.g., a near field wireless communication network), or may communicate with an electronic device 1404 or a server 1408 through a second network 1499 (e.g., a long distance wireless communication network). In some embodiments, the electronic device 1401 may communicate with the electronic device 1404 through the server 1408. In some embodiments, the electronic device 1401 may include a processor 1420, a memory 1430, an input device 1450, a sound output device 1455, a display device 1460, an audio module 1470, a sensor module 1476, an interface 1477, a haptic module 1479, a camera module 1480, a power management module 1488, a battery 1489, a communication module 1490, a subscriber identification module 1496, or an antenna module 1497. In some embodiments, at least one (e.g., the display device 1460 or the camera module 1480) of the components may be omitted from the electronic device 1401 or one or more other components may be added. In some embodiments, some of the components may be implemented with one integrated circuit. For example, the sensor module 1476 (e.g., a fingerprint sensor, an iris sensor, or an illumination sensor) may be implemented while being embedded in the display device 1460 (e.g., a display).

The processor 1420, for example, may control at least one component (e.g., a hardware or software component) of the electronic device 1401 connected to the processor 1420 by executing software (e.g., a program 1440), and may perform various data processing or calculations. In some embodiments, as at least a part of data processing or calculations, the processor 1420 may load a command or data received from another component (e.g., the sensor module 1476 or the communication module 1490) in a volatile memory 1432, may process a command or data stored in the volatile memory 1432, and may store result data in the volatile memory 1434. According to an embodiment, the processor 1420 may include a main processor 1421 (e.g., a central processing device or an application processor), and an auxiliary processor 1423 (e.g., a graphic processing device, an image signal processor, a sensor hub processor, or a communication processor) which may be operated independently from or together with the main processor 1421. Additionally or alternatively, the auxiliary processor 1423 may use lower power than the main processor 1421, or may be set to be specific to a designated function. The auxiliary processor 1423 may be implemented separately from or a part of the main processor 1421.

The auxiliary processor 1423, for example, may control at least some of functions or states related to at least one component (e.g., the display device 1460, the sensor module 1476, or the communication module 1490) of the components of the electronic device 1401 in replacement of the main processor 1421 while the main processor 1421 is in an inactive (e.g., sleep) state, or together with the main processor 1421 while the main processor 1421 is in an active (e.g., application execution) state. In some embodiments, the auxiliary processor 1423 (e.g., an image signal processor or a communication processor) may be implemented as a part of another component (e.g., the camera module 1480 or the communication module 1490) which is functionally relevant.

The memory 1430 may store various data used by at least one component (e.g., the processor 1420 or the sensor module 1476) of the electronic device 1401. The data, for example, may include software (e.g., a program 1440), and input data or output data for a related command. The memory 1430 may include a volatile memory 1432 or a nonvolatile memory 1434.

The program 1440 may be stored in the memory 1430 as software, and for example, may include an operating system 1442, middleware 1444, or an application 1446.

The input device 1450 may receive a command or data, which will be used in a component (e.g., the processor 1420) of the electronic device 1401 from the outside (e.g., the user) of the electronic device 1401. The input device 1450, for example, may include a microphone, a mouse, a keyboard, or a digital pen (e.g., a stylus pen).

The sound output device 1455 may output a sound signal to the outside of the electronic device 1401. The sound output device 1455, for example, may include a speaker or a receiver. The speaker may be used for a general purpose, such as playback of multimedia or recording/reproduction, and the receiver may be used to receive a terminating line phone. In some embodiments, the receiver may be implemented separately from the speaker or as a part thereof.

The display device 1460 may visually provide information to the outside (e.g., the user) of the electronic device 1401. The display device 1460, for example, may include a display, a hologram device, or a projector, and a control circuit for controlling the corresponding device. In some embodiments, the display device 1460 may include a touch circuit configured to detect a touch, or a sensor circuit (e.g., a pressure sensor) configured to measure the strength of a force generated by the touch.

The audio module 1470 may convert a sound to an electric signal or inversely convert an electric signal to a sound. According to an embodiment, the audio module 1470 may acquire a sound through the input device 1450 or may output a sound through the sound output device 1455 or an external electronic device (e.g., the electronic device 1401) (e.g., a speaker or a headphone) directly or wirelessly connected to the electronic device 1402.

The sensor module 1476 may detect an operation state (e.g., power or a temperature) of the electronic device 1401 or a state (e.g., the user state) of an external environment, and may generate an electric signal or a data value corresponding to the detected state. According to an embodiment, the sensor module 1476, for example, may include a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illumination sensor.

The interface 1477 may support one or more designated protocols that may be used to connect the electronic device 1401 to an external electronic device (e.g., the electronic device 1402) directly or wirelessly. In some embodiments, the interface 1477, for example, may include a high definition multimedia interface (HDMI), a universal serial bus (USB) interface, an SD card interface, or an audio interface.

A connection terminal 1478 may include a connector, through which the electronic device 1401 may be physically connected to an external electronic device (e.g., the electronic device 1402). According to an embodiment, the connection terminal 1478, for example, may include a HDMI connector, a USB connector, an SD card connector, or an audio connector (e.g., a headphone connector).

The haptic module 1479 may convert an electric signal to a mechanical stimulus (e.g., vibration or a motion) or an electrical stimulus that may be recognized by the user through a haptic feeling or a sense of motion. According to an embodiment, the haptic module 1479, for example, may include a motor, a piezoelectric element, or an electrical stimulus device.

The camera module 1480 may capture a still image or a video. According to an embodiment, the camera module 1480 may include one or more lenses, image sensors, image signal processors, or flashes.

The power management module 1488 may manage power supplied to the electronic device 1401. According to an embodiment, the power management module 1488, for example, may be implemented as at least a part of a power management integrated circuit (PMIC).

The battery 1489 may supply power to at least one component of the electronic device 1401. In some embodiments, the battery 1489, for example, may include a primary cell that cannot be recharged, a secondary cell, or a fuel cell.

The communication module 1490 may support establishment of a direct (e.g., wired) communication channel or a wireless communication channel between the electronic device 1401 and the external electronic device (e.g., the electronic device 1402, the electronic device 1404, or the server 1408), and execution of communication through the established communication channel. The communication module 1490 may include one or more communication processors that is operated independently from the processor 1420 (e.g., an application processor) and supports direct (e.g., wired) communication or wireless communication. According to an embodiment, the communication module 1490 may include a wireless communication module 1492 (e.g., a cellular communication module, a near field wireless communication module, or a global navigation satellite system (GNSS) communication module) or a wired communication module 1494 (e.g., a local area network (LAN) communication module or a power line communication module). Among the communication modules, the corresponding communication module may communicate with an external electronic device 1404 through the first network 1498 (e.g., a near field communication network such as Bluetooth, WiFi direct, or infrared data association (IrDA)) or the second network 1499 (e.g., a long distance communication network such as a cellular network, the internet, or a computer network (e.g., LAN or WAN)). The several kinds of communication modules may be integrated into one component (e.g., a single chip) or may be implemented by a plurality of separate components (e.g., a plurality of chips). The wireless communication module 1492 may identify or verify the electronic device 1401 in a communication network such as the first network 1498 or the second network 1499 by using subscriber information (e.g., an international mobile subscriber identifier (IMSI)) stored in the subscriber identification module 1496.

The antenna module 1497 may transmit a signal or power to the outside (e.g., an external electronic device) or receive a signal or power from the outside. According to an embodiment, the antenna module 1497 may include one antenna including a conductor formed on a substrate (e.g., a PCB) or a radiator with a conductive pattern. According to an embodiment, the antenna module 1497 may include a plurality of antennas. In this case, at least one antenna that is suitable for a communication scheme used in a communication network such as the first network 1498 or the second network 1499, for example, may be selected from the plurality of antennas by the communication module 1490. A signal or power may be transmitted or received between the communication module 1490 and an external electronic device through the selected at least one antenna. In some embodiments, in addition to the radiator, another component (e.g., a RFIC) may be additionally formed as a part of the antenna module 1497.

At least some of the components may be connected to each other through a communication scheme (e.g., a bus, a general purpose input and output (GPIO), a serial peripheral interface (SPI), or a mobile industry processor interface (MIPI)) between peripheral devices, and may exchange signals (e.g., a command or data).

In some embodiments, a command or data may be transmitted or received between the electronic device 1401 and the external electronic device 1404 through the server connected to the second network 1499. The electronic device 1402 or 1404 may be a device that is the same as or different from the electronic device 1401. According to an embodiment, all or some of the operations executed by the electronic device 1401 may be executed by one or more external devices of the external electronic devices 1402, 1404, or 1408. For example, when the electronic device 1401 has to perform some functions or services automatically or in response to a request from the user or another device, the electronic device 1401 may request one or more external electronic devices to perform at least some of the functions or services in replacement of self-execution of the functions or services or additionally. One or more external electronic devices that received the request executes at least some of the requested functions or services or an additional function or service related to the request, and may deliver the execution result to the electronic device 1401. The electronic device 1401 may process the result as it is or additionally to provide the processed result as at least a part of a response to the request. To this end, for example, the cloud computing, distributed computing, or client-server computing technologies may be used.

An electronic device may include devices of various forms. The electronic devices, for example, may include a portable communication device (e.g., a smart phone), a computer device, a portable multimedia device, a portable medical device, a camera, a wearable device, or a home appliance. An electronic device according to various embodiments of the disclosure is not limited to the above-mentioned devices.

Various embodiments of the disclosure and the terms used herein do not limit the technical features described in the disclosure to specific embodiments, and should be construed to include various modifications, equivalents, or replacements of the embodiments. With regard to the description of the drawings, similar reference numerals may be used to refer to similar or related components. It is to be understood that a singular form of a noun corresponding to an item may include one or more of the things, unless the relevant context clearly indicates otherwise. In the disclosure, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. Such terms as "1st" and "2nd"

or "first" and "second" may be used to simply distinguish a corresponding component from another, and does not limit the components in other aspects (e.g., an importance or an order). It is to be understood that if a component (e.g., a first component) is referred to, with or without the term "operatively" or "communicatively", as "coupled with" or "connected with", it means that the component may be coupled with the other component directly (e.g., by wire), wirelessly, or via a third component.

The term "module" used in the disclosure may include a unit configured in a hardware, software, or firmware way, and for example, may be used interchangeably with the terms such as logic, a logic block, a component, or a circuit. The module may be an integral part, or a minimum unit or a portion which performs one or more functions. For example, according to an embodiment, the module may be implemented in a form of an application-specific integrated circuit (ASIC).

Various embodiments of the disclosure may be implemented by software (e.g., a program 1440) including one or more instructions stored in a storage medium (e.g., an internal memory 1436 or an external memory 1438) that may be read by the electronic device 1401. For example, the processor (e.g., the processor 1402) of the device (e.g., the electronic device 1401) may call at least one of one or more instructions stored in a the storage medium, and may execute it. This allows at least one function to be performed according to the called at least one instruction. The one or more instructions may include a code that is made by a compiler or a code that may be executed by an interpreter. The storage medium that may be read by a device may be provided in a form of a non-transitory storage medium. Here, the 'non-transitory storage medium' means that the storage medium is a tangible device and does not include a signal (e.g., an electromagnetic wave), and with regard to the term, a case, in which data are semi-permanently stored in the storage medium, and a case, in which data are temporarily stored in the storage medium, are not distinguished. For example, the non-transitory storage medium' may include a buffer, in which data are temporarily stored.

According to an embodiment, the methods according to various embodiments of the disclosure may be provided to be included in a computer program product. The computer program product may be traded between a seller and a purchaser. The computer program product may be distributed in a form of a storage medium that may be read by a device (e.g., a compact disk read only memory (CD-ROM) or may be distributed (e.g., downloaded or uploaded) through an application store (e.g., Play Store™) or directly or online between two user devices (e.g., smartphones). In the online distribution, at least a portion of the computer program product (e.g., a downloadable app) may be at least temporarily stored in a storage medium, such as a server of a manufacturer, a server of an application store, or a memory of a relay server, which may be read by a device, or temporarily generated.

According to various embodiments, the components (e.g., modules or programs) of the above-described components may include a single or a plurality of entities. According to various embodiments, among the above-described components, one or more components or operations may be omitted or one or more other components or operations may be added. Alternatively or additionally, the plurality of components (e.g., modules or programs) may be integrated into one component. In this case, the integrated components may perform one or more functions of the plurality of components in a way that is the same as or similar to that performed by the corresponding ones of the plurality of components before the integration. According to various embodiments, the operations performed by modules, programs, or other components may be executed sequentially, in parallel, repeatedly, or heuristically, one or more operations may be executed in another sequence or omitted, or one or more other operations may be added.

An electronic device according to various embodiments disclosed in the disclosure may include devices of various forms. The electronic devices, for example, may include a portable communication device (e.g., a smart phone), a computer device, a portable multimedia device, a portable medical device, a camera, a wearable device, or a home appliance. An electronic device according to various embodiments of the disclosure is not limited to the above-mentioned devices.

According to various embodiments, the components (e.g., modules or programs) of the above-described components may include a single or a plurality of entities. According to various embodiments, among the above-described components, one or more components or operations may be omitted or one or more other components or operations may be added. Alternatively or additionally, the plurality of components (e.g., modules or programs) may be integrated into one component. In this case, the integrated components may perform one or more functions of the plurality of components in a way that is the same as or similar to that performed by the corresponding ones of the plurality of components before the integration. According to various embodiments, the operations performed by modules, programs, or other components may be executed sequentially, in parallel, repeatedly, or heuristically, one or more operations may be executed in another sequence or omitted, or one or more other operations may be added.

Although the detailed embodiments have been described, it is apparent that various modifications may be made without departing from the scope of the disclosure.

What is claimed is:

1. A coupler comprising:
   a first layer comprising a first electrically conductive flat plate,
   a first electrically conductive part,
   a capacitor connecting port,
   and a first opening formed at the first electrically conductive part;
   a second layer comprising a signal transmission line electrically connected to the first electrically conductive flat plate,
   and comprising a first line port configured to input a signal output from a wireless communication circuit,
   and a second line port electrically connected to an antenna;
   a third layer electrically connected to the first electrically conductive flat plate and comprising a first electrically conductive pattern electrically connected to the signal transmission line,
   wherein the capacitor connecting port is configured to be connected to a capacitor external to the coupler, and
   wherein the first electrically conductive flat plate is electrically isolated from the first electrically conductive part by the first opening.

2. The coupler of claim 1, further comprising:
   the capacitor electrically connected through the capacitor connecting port to the first electrically conductive flat plate.

3. The coupler of claim 2, wherein the first electrically conductive flat plate comprises:

a first hole periphery part defining a first via hole configured to allow electrical connection; and an extension part extending from the first hole periphery part and overlapping at least a portion of the signal transmission line, the extension part being spaced apart from the signal transmission line at a specific interval, and wherein the capacitor is electrically connected to the extension part.

4. The coupler of claim 1, wherein the second layer further comprises:
a second electrically conductive part that is electrically conductive and electrically connected to the first electrically conductive part;
a second opening formed at at least a portion of an inside of the second electrically conductive part; and
a second electrically conductive flat plate disposed in the second opening, the second electrically conductive flat plate defining a second via hole that is electrically connected to a first via hole.

5. The coupler of claim 4, wherein the third layer further comprises:
a third electrically conductive part that is electrically conductive and electrically connected to the second electrically conductive part;
a third opening formed at at least a portion of an inside of the third electrically conductive part; and
a third electrically conductive flat plate disposed in the third opening and is electrically connected to the first electrically conductive pattern, the third electrically conductive flat plate defining a third via hole electrically connected to the second via hole.

6. The coupler of claim 5, wherein an area of the first electrically conductive flat plate is larger than an area of the third electrically conductive flat plate.

7. The coupler of claim 5, further comprising:
a fourth layer adjacent to the third layer,
wherein the fourth layer comprises:
a fourth electrically conductive part that is electrically connected to the third electrically conductive part and is electrically conductive;
a fourth opening formed at at least a portion of an inside of the fourth electrically conductive part; and
a second electrically conductive pattern disposed in the fourth opening and electrically connected to the first electrically conductive flat plate.

8. The coupler of claim 7, wherein the first electrically conductive pattern comprises a first pattern via hole formed on one side thereof, and
wherein the second electrically conductive pattern comprises:
a second pattern via hole electrically connected to the first pattern via hole; and
a terminal port electrically connected to a terminal resistor.

9. The coupler of claim 1, wherein the first electrically conductive pattern has at least one turn.

10. The coupler of claim 9, wherein the first electrically conductive pattern further comprises:
a first coiling portion coiled in a first direction; and
a second coiling portion coiled in a second direction.

11. The coupler of claim 10, wherein one end of the first coiling portion comprises a coupling port configured to transmit a coupling signal to the wireless communication circuit.

12. The coupler of claim 1, wherein the first layer further comprises a fourth electrically conductive flat plate electrically connected to the first electrically conductive flat plate, the fourth electrically conductive flat plate defining a via hole of the fourth electrically conductive flat plate.

13. The coupler of claim 12, further comprising:
a fifth layer adjacent to the first layer,
wherein the fifth layer comprises:
a hole periphery part of the fifth layer defining a via hole of the fifth layer electrically connected to the via hole of the fourth electrically conductive flat plate; and
a first capacitor via hole electrically connected to the hole periphery part of the fifth layer.

14. The coupler of claim 13, further comprising:
a sixth layer adjacent to the fifth layer,
wherein the sixth layer comprises a capacitor connecting pad defining a second capacitor via hole, the second capacitor via hole being electrically connected to the first capacitor via hole, and
wherein the capacitor is electrically connected to the first electrically conductive flat plate by the second capacitor via hole.

15. The coupler of claim 1, wherein the capacitor comprises at least one of a tunable capacitor and a shunt capacitor,
wherein the signal transmission line comprises at least one of:
a first signal transmission line configured to transmit a signal of a first frequency band; and
a second signal transmission line configured to transmit a signal of a second frequency band that is different from the first frequency band.

16. The coupler of claim 1, wherein at least a portion of the first opening is filled with an insulating material.

17. A printed circuit board comprising:
a capacitor; and
a coupler embedded in the printed circuit board,
wherein the coupler comprises:
a first layer comprising a first electrically conductive flat plate,
a first electrically conductive part,
a capacitor connecting port,
and a first opening formed at the first electrically conductive part; and
a second layer comprising a signal transmission line electrically connected to the first electrically conductive flat plate,
and comprising a first line port configured to input a signal output from a wireless communication circuit, and a second line port electrically connected to an antenna;
a third layer electrically connected to the first electrically conductive flat plate and comprising a first electrically conductive pattern electrically connected to the signal transmission line,
wherein the capacitor connecting port is configured to be connected to the capacitor external to the coupler,
wherein the first electrically conductive flat plate is electrically isolated from the first electrically conductive part by the first opening, and
wherein the capacitor is electrically connected through the capacitor connecting port to the first electrically conductive flat plate by the first opening.

* * * * *